United States Patent
Wassvik et al.

(10) Patent No.: US 10,146,376 B2
(45) Date of Patent: Dec. 4, 2018

(54) LIGHT COUPLING IN TIR-BASED OPTICAL TOUCH SYSTEMS

(71) Applicant: FlatFrog Laboratories AB, Lund (SE)

(72) Inventors: Ola Wassvik, Rossby (SE); Håkan Bergström, Torna Hällestad (SE)

(73) Assignee: FlatFrog Laboratories AB, Lund (SE)

( * ) Notice: Subject to any disclaimer, the term of this patent is extended or adjusted under 35 U.S.C. 154(b) by 42 days.

(21) Appl. No.: 15/112,134

(22) PCT Filed: Jan. 16, 2015

(86) PCT No.: PCT/SE2015/050043
§ 371 (c)(1),
(2) Date: Jul. 15, 2016

(87) PCT Pub. No.: WO2015/108479
PCT Pub. Date: Jul. 23, 2015

(65) Prior Publication Data
US 2016/0328091 A1   Nov. 10, 2016

(30) Foreign Application Priority Data
Jan. 16, 2014  (SE) ....................................... 1450038

(51) Int. Cl.
*G06F 3/042* (2006.01)
*H01S 5/42* (2006.01)

(52) U.S. Cl.
CPC ............ *G06F 3/0428* (2013.01); *G06F 3/042* (2013.01); *H01S 5/423* (2013.01); *G06F 2203/04109* (2013.01)

(58) Field of Classification Search
CPC .................. G06F 3/042; G06F 3/0428; G06F 2203/04109; H01S 5/423
See application file for complete search history.

(56) References Cited

U.S. PATENT DOCUMENTS 3,440,426 A    4/1969  Bush
3,553,680 A    1/1971  Cooreman
(Continued)

FOREIGN PATENT DOCUMENTS

CN    201233592 Y    5/2009
CN    101644854 A    2/2010
(Continued)

OTHER PUBLICATIONS

Ahn, Y., et al., "A slim and wide multi-touch tabletop interface and its applications," BigComp2014, IEEE, 2014, in 6 pages.
(Continued)

*Primary Examiner* — Larry Lee
(74) *Attorney, Agent, or Firm* — Knobbe, Martens, Olson & Bear, LLP

(57) ABSTRACT

A touch-sensitive apparatus operates by light frustration (FTIR) and comprises a light transmissive panel that defines a front surface and a rear surface, a light emitter optically connected to the panel so as to generate light that propagates by total internal reflection inside the panel, and a light detector optically connected to the panel to receive propagating light from the emitter. The emitter is a VCSEL array including a number of VCSELs driven to collectively form one light emitter, and a light coupling mechanism connecting the emitter to the panel is configured to give light from a plurality of the VCSELs in the VCSEL array substantially the same spread in the panel.

20 Claims, 9 Drawing Sheets

(56) References Cited

U.S. PATENT DOCUMENTS

| | | |
|---|---|---|
| 3,673,327 A | 6/1972 | Johnson et al. |
| 4,129,384 A | 12/1978 | Walker et al. |
| 4,180,702 A | 12/1979 | Sick et al. |
| 4,209,255 A | 6/1980 | Heynau et al. |
| 4,213,707 A | 7/1980 | Evans, Jr. |
| 4,254,333 A | 3/1981 | Bergström |
| 4,254,407 A | 3/1981 | Tipon |
| 4,294,543 A | 10/1981 | Apple et al. |
| 4,346,376 A | 8/1982 | Mallos |
| 4,420,261 A | 12/1983 | Barlow et al. |
| 4,484,179 A | 11/1984 | Kasday |
| 4,507,557 A | 3/1985 | Tsikos |
| 4,521,112 A | 6/1985 | Kuwabara et al. |
| 4,542,375 A | 9/1985 | Alles et al. |
| 4,550,250 A | 10/1985 | Mueller et al. |
| 4,593,191 A | 6/1986 | Alles |
| 4,673,918 A | 6/1987 | Adler et al. |
| 4,688,933 A | 8/1987 | Lapeyre |
| 4,688,993 A | 8/1987 | Ferris et al. |
| 4,692,809 A | 9/1987 | Beining et al. |
| 4,710,760 A | 12/1987 | Kasday |
| 4,736,191 A | 4/1988 | Matzke et al. |
| 4,737,626 A | 4/1988 | Hasegawa |
| 4,746,770 A | 5/1988 | McAvinney |
| 4,752,655 A | 6/1988 | Tajiri et al. |
| 4,772,763 A | 9/1988 | Garwin et al. |
| 4,782,328 A | 11/1988 | Denlinger |
| 4,812,833 A | 3/1989 | Shimauchi |
| 4,837,430 A | 6/1989 | Hasegawa |
| 4,868,912 A | 9/1989 | Doering |
| 4,891,829 A | 1/1990 | Deckman et al. |
| 4,933,544 A | 6/1990 | Tamaru |
| 4,949,079 A | 8/1990 | Loebner |
| 4,986,662 A | 1/1991 | Bures |
| 4,988,983 A | 1/1991 | Wehrer |
| 5,065,185 A | 11/1991 | Powers et al. |
| 5,073,770 A | 12/1991 | Lowbner |
| 5,105,186 A | 4/1992 | May |
| 5,159,322 A | 10/1992 | Loebner |
| 5,166,668 A | 11/1992 | Aoyagi |
| 5,227,622 A | 7/1993 | Suzuki |
| 5,248,856 A | 9/1993 | Mallicoat |
| 5,254,407 A | 10/1993 | Sergerie et al. |
| 5,345,490 A | 9/1994 | Finnigan et al. |
| 5,383,022 A | 1/1995 | Kaser |
| 5,483,261 A | 1/1996 | Yasutake |
| 5,484,966 A | 1/1996 | Segen |
| 5,499,098 A | 3/1996 | Ogawa |
| 5,502,568 A | 3/1996 | Ogawa et al. |
| 5,525,764 A | 6/1996 | Junkins et al. |
| 5,526,422 A | 6/1996 | Keen |
| 5,539,514 A | 7/1996 | Shishido et al. |
| 5,570,181 A | 10/1996 | Yasuo et al. |
| 5,572,251 A | 11/1996 | Ogawa |
| 5,577,501 A | 11/1996 | Flohr et al. |
| 5,600,105 A | 2/1997 | Fukuzaki et al. |
| 5,672,852 A | 9/1997 | Fukuzaki et al. |
| 5,679,930 A | 10/1997 | Katsurahira |
| 5,686,942 A | 11/1997 | Ball |
| 5,688,933 A | 11/1997 | Evans et al. |
| 5,729,249 A | 3/1998 | Yasutake |
| 5,736,686 A | 4/1998 | Perret, Jr. et al. |
| 5,740,224 A | 4/1998 | Müller et al. |
| 5,764,223 A | 6/1998 | Chang et al. |
| 5,767,517 A | 6/1998 | Hawkins |
| 5,775,792 A | 7/1998 | Wiese |
| 5,945,980 A | 8/1999 | Moissev et al. |
| 5,945,981 A | 8/1999 | Paull et al. |
| 5,959,617 A | 9/1999 | Bird et al. |
| 6,061,177 A | 5/2000 | Fujimoto |
| 6,067,079 A | 5/2000 | Shieh |
| 6,122,394 A | 9/2000 | Neukermans et al. |
| 6,141,104 A | 10/2000 | Schulz et al. |
| 6,172,667 B1 | 1/2001 | Sayag |
| 6,227,667 B1 | 5/2001 | Halldorsson et al. |
| 6,229,529 B1 | 5/2001 | Yano et al. |
| 6,333,735 B1 | 12/2001 | Anvekar |
| 6,366,276 B1 | 4/2002 | Kunimatsu et al. |
| 6,380,732 B1 | 4/2002 | Gilboa |
| 6,380,740 B1 | 4/2002 | Laub |
| 6,390,370 B1 | 5/2002 | Plesko |
| 6,429,857 B1 | 8/2002 | Masters et al. |
| 6,452,996 B1 | 9/2002 | Hsieh |
| 6,476,797 B1 | 11/2002 | Kurihara et al. |
| 6,492,633 B2 | 12/2002 | Nakazawa et al. |
| 6,495,832 B1 | 12/2002 | Kirby |
| 6,504,143 B2 | 1/2003 | Koops et al. |
| 6,529,327 B1 | 3/2003 | Graindorge |
| 6,538,644 B1 | 3/2003 | Muraoka |
| 6,587,099 B2 | 7/2003 | Takekawa |
| 6,648,485 B1 | 11/2003 | Colgan et al. |
| 6,660,964 B1 | 12/2003 | Benderly |
| 6,664,498 B2 | 12/2003 | Forsman et al. |
| 6,664,952 B2 | 12/2003 | Iwamoto et al. |
| 6,690,363 B2 | 2/2004 | Newton |
| 6,707,027 B2 | 3/2004 | Liess et al. |
| 6,738,051 B2 | 5/2004 | Boyd et al. |
| 6,748,098 B1 | 6/2004 | Rosenfeld |
| 6,784,948 B2 | 8/2004 | Kawashima et al. |
| 6,799,141 B1 | 9/2004 | Stoustrup et al. |
| 6,806,871 B1 | 10/2004 | Yasue |
| 6,927,384 B2 | 8/2005 | Reime et al. |
| 6,940,286 B2 | 9/2005 | Wang et al. |
| 6,965,836 B2 | 11/2005 | Richardson |
| 6,972,753 B1 | 12/2005 | Kimura et al. |
| 6,985,137 B2 | 1/2006 | Kaikuranta |
| 7,042,444 B2 | 5/2006 | Cok |
| 7,084,859 B1 | 8/2006 | Pryor |
| 7,087,907 B1 | 8/2006 | Lalovic et al. |
| 7,133,031 B2 | 11/2006 | Wang et al. |
| 7,176,904 B2 | 2/2007 | Satoh |
| 7,359,041 B2 | 4/2008 | Xie et al. |
| 7,397,418 B1 | 7/2008 | Doerry et al. |
| 7,432,893 B2 | 10/2008 | Ma et al. |
| 7,435,940 B2 | 10/2008 | Eliasson et al. |
| 7,442,914 B2 | 10/2008 | Eliasson et al. |
| 7,465,914 B2 | 12/2008 | Eliasson et al. |
| 7,613,375 B2 | 11/2009 | Shimizu |
| 7,629,968 B2 | 12/2009 | Miller et al. |
| 7,646,833 B1 | 1/2010 | He et al. |
| 7,653,883 B2 | 1/2010 | Hotelling et al. |
| 7,655,901 B2 | 2/2010 | Idzik et al. |
| 7,705,835 B2 | 4/2010 | Eikman |
| 7,847,789 B2 | 12/2010 | Kolmykov-Zotov et al. |
| 7,855,716 B2 | 12/2010 | McCreary et al. |
| 7,859,519 B2 | 12/2010 | Tulbert |
| 7,924,272 B2 | 4/2011 | Boer et al. |
| 7,932,899 B2 | 4/2011 | Newton et al. |
| 7,969,410 B2 | 6/2011 | Kakarala |
| 7,995,039 B2 | 8/2011 | Eliasson et al. |
| 8,013,845 B2 | 9/2011 | Ostergaard et al. |
| 8,031,186 B2 | 10/2011 | Ostergaard |
| 8,077,147 B2 | 12/2011 | Krah et al. |
| 8,093,545 B2 | 1/2012 | Leong et al. |
| 8,094,136 B2 | 1/2012 | Eliasson et al. |
| 8,094,910 B2 | 1/2012 | Xu |
| 8,149,211 B2 | 4/2012 | Hayakawa et al. |
| 8,218,154 B2 | 7/2012 | Østergaard et al. |
| 8,274,495 B2 | 9/2012 | Lee |
| 8,325,158 B2 | 12/2012 | Yatsuda et al. |
| 8,339,379 B2 | 12/2012 | Goertz et al. |
| 8,350,827 B2 | 1/2013 | Chung et al. |
| 8,384,010 B2 | 2/2013 | Hong et al. |
| 8,407,606 B1 | 3/2013 | Davidson et al. |
| 8,441,467 B2 | 5/2013 | Han |
| 8,445,834 B2 | 5/2013 | Hong et al. |
| 8,466,901 B2 | 6/2013 | Yen et al. |
| 8,482,547 B2 | 7/2013 | Cobon et al. |
| 8,542,217 B2 | 9/2013 | Wassvik et al. |
| 8,567,257 B2 | 10/2013 | Van Steenberge et al. |
| 8,581,884 B2 | 11/2013 | Fåhraeus et al. |
| 8,624,858 B2 | 1/2014 | Fyke et al. |
| 8,686,974 B2 | 4/2014 | Christiansson et al. |
| 8,692,807 B2 | 4/2014 | Føhraeus et al. |

(56) References Cited

U.S. PATENT DOCUMENTS

| | | |
|---|---|---|
| 8,716,614 B2 | 5/2014 | Wassvik |
| 8,727,581 B2 | 5/2014 | Saccomanno |
| 8,745,514 B1 | 6/2014 | Davidson |
| 8,780,066 B2 | 7/2014 | Christiansson et al. |
| 8,830,181 B1 | 9/2014 | Clark et al. |
| 8,860,696 B2 | 10/2014 | Wassvik et al. |
| 8,872,098 B2 | 10/2014 | Bergström et al. |
| 8,872,801 B2 | 10/2014 | Bergström et al. |
| 8,884,900 B2 | 11/2014 | Wassvik |
| 8,890,843 B2 | 11/2014 | Wassvik et al. |
| 8,890,849 B2 | 11/2014 | Christiansson et al. |
| 8,928,590 B1 | 1/2015 | El Dokor |
| 8,963,886 B2 | 2/2015 | Wassvik |
| 8,982,084 B2 | 3/2015 | Christiansson et al. |
| 9,024,916 B2 | 5/2015 | Christiansson |
| 9,035,909 B2 | 5/2015 | Christiansson |
| 9,063,617 B2 | 6/2015 | Eliasson et al. |
| 9,086,763 B2 | 7/2015 | Johansson et al. |
| 9,134,854 B2 | 9/2015 | Wassvik et al. |
| 9,158,401 B2 | 10/2015 | Christiansson |
| 9,158,415 B2 | 10/2015 | Song et al. |
| 9,213,445 B2 | 12/2015 | King et al. |
| 9,274,645 B2 | 3/2016 | Christiansson et al. |
| 9,317,168 B2 | 4/2016 | Christiansson et al. |
| 9,323,396 B2 | 4/2016 | Han et al. |
| 9,366,565 B2 | 6/2016 | Uvnäs |
| 9,377,884 B2 | 6/2016 | Christiansson et al. |
| 9,389,732 B2 | 7/2016 | Craven-Bartle |
| 9,411,444 B2 | 8/2016 | Christiansson et al. |
| 9,411,464 B2 | 8/2016 | Wallander et al. |
| 9,430,079 B2 | 8/2016 | Christiansson et al. |
| 9,442,574 B2 | 9/2016 | Fåhraeus et al. |
| 9,547,393 B2 | 1/2017 | Christiansson et al. |
| 9,552,103 B2 | 1/2017 | Craven-Bartle et al. |
| 9,557,846 B2 | 1/2017 | Baharav et al. |
| 9,588,619 B2 | 3/2017 | Christiansson et al. |
| 9,594,467 B2 | 3/2017 | Christiansson et al. |
| 9,626,018 B2 | 4/2017 | Christiansson et al. |
| 9,626,040 B2 | 4/2017 | Wallander et al. |
| 9,639,210 B2 | 5/2017 | Wallander et al. |
| 9,678,602 B2 | 6/2017 | Wallander |
| 9,684,414 B2 | 6/2017 | Christiansson et al. |
| 9,710,101 B2 | 7/2017 | Christiansson et al. |
| 2001/0002694 A1 | 6/2001 | Nakazawa et al. |
| 2001/0005004 A1 | 6/2001 | Shiratsuki et al. |
| 2001/0005308 A1 | 6/2001 | Oishi et al. |
| 2001/0030642 A1 | 10/2001 | Sullivan et al. |
| 2002/0067348 A1 | 6/2002 | Masters et al. |
| 2002/0075243 A1 | 6/2002 | Newton |
| 2002/0118177 A1 | 8/2002 | Newton |
| 2002/0158823 A1 | 10/2002 | Zavracky et al. |
| 2002/0158853 A1 | 10/2002 | Sugawara et al. |
| 2002/0163505 A1 | 11/2002 | Takekawa |
| 2003/0016450 A1 | 1/2003 | Bluemel et al. |
| 2003/0034439 A1 | 2/2003 | Reime et al. |
| 2003/0034935 A1 | 2/2003 | Amanai et al. |
| 2003/0048257 A1 | 3/2003 | Mattila |
| 2003/0052257 A1 | 3/2003 | Sumriddetchkajorn |
| 2003/0095399 A1 | 5/2003 | Grenda et al. |
| 2003/0107748 A1 | 6/2003 | Lee |
| 2003/0137494 A1 | 7/2003 | Tulbert |
| 2003/0156100 A1 | 8/2003 | Gettemy |
| 2003/0160155 A1 | 8/2003 | Liess |
| 2003/0210537 A1 | 11/2003 | Engelmann |
| 2003/0214486 A1 | 11/2003 | Roberts |
| 2004/0027339 A1 | 2/2004 | Schulz |
| 2004/0032401 A1 | 2/2004 | Nakazawa et al. |
| 2004/0090432 A1 | 5/2004 | Takahashi et al. |
| 2004/0130338 A1 | 7/2004 | Wang et al. |
| 2004/0174541 A1 | 9/2004 | Freifeld |
| 2004/0201579 A1 | 10/2004 | Graham |
| 2004/0212603 A1 | 10/2004 | Cok |
| 2004/0238627 A1 | 12/2004 | Silverbrook et al. |
| 2004/0239702 A1 | 12/2004 | Kang et al. |
| 2004/0245438 A1 | 12/2004 | Payne et al. |
| 2004/0252091 A1 | 12/2004 | Ma et al. |
| 2004/0252867 A1 | 12/2004 | Lan et al. |
| 2005/0012714 A1 | 1/2005 | Russo et al. |
| 2005/0041013 A1 | 2/2005 | Tanaka |
| 2005/0057903 A1 | 3/2005 | Choi |
| 2005/0073508 A1 | 4/2005 | Pittel et al. |
| 2005/0083293 A1 | 4/2005 | Dixon |
| 2005/0128190 A1 | 6/2005 | Ryynanen |
| 2005/0143923 A1 | 6/2005 | Keers et al. |
| 2005/0156914 A1 | 7/2005 | Lipman et al. |
| 2005/0162398 A1 | 7/2005 | Eliasson et al. |
| 2005/0179977 A1 | 8/2005 | Chui et al. |
| 2005/0200613 A1 | 9/2005 | Kobayashi et al. |
| 2005/0212774 A1 | 9/2005 | Ho et al. |
| 2005/0248540 A1 | 11/2005 | Newton |
| 2005/0253834 A1 | 11/2005 | Sakamaki et al. |
| 2005/0276053 A1 | 12/2005 | Nortrup et al. |
| 2006/0001650 A1 | 1/2006 | Robbins et al. |
| 2006/0001653 A1 | 1/2006 | Smits |
| 2006/0007185 A1 | 1/2006 | Kobayashi |
| 2006/0008164 A1 | 1/2006 | Wu et al. |
| 2006/0017706 A1 | 1/2006 | Cutherell et al. |
| 2006/0017709 A1 | 1/2006 | Okano |
| 2006/0033725 A1 | 2/2006 | Marggraff et al. |
| 2006/0038698 A1 | 2/2006 | Chen |
| 2006/0061861 A1 | 3/2006 | Munro et al. |
| 2006/0114237 A1 | 6/2006 | Crockett et al. |
| 2006/0132454 A1 | 6/2006 | Chen et al. |
| 2006/0139340 A1 | 6/2006 | Geaghan |
| 2006/0158437 A1 | 7/2006 | Blythe et al. |
| 2006/0170658 A1 | 8/2006 | Nakamura et al. |
| 2006/0202974 A1 | 9/2006 | Thielman |
| 2006/0227120 A1 | 10/2006 | Eikman |
| 2006/0255248 A1 | 11/2006 | Eliasson |
| 2006/0256092 A1 | 11/2006 | Lee |
| 2006/0279558 A1 | 12/2006 | Van Delden et al. |
| 2006/0281543 A1 | 12/2006 | Sutton et al. |
| 2006/0290684 A1 | 12/2006 | Giraldo et al. |
| 2007/0014486 A1 | 1/2007 | Schiwietz et al. |
| 2007/0024598 A1 | 2/2007 | Miller et al. |
| 2007/0034783 A1 | 2/2007 | Eliasson et al. |
| 2007/0038691 A1 | 2/2007 | Candes et al. |
| 2007/0052684 A1 | 3/2007 | Gruhlke et al. |
| 2007/0070056 A1 | 3/2007 | Sato et al. |
| 2007/0075648 A1 | 4/2007 | Blythe et al. |
| 2007/0120833 A1 | 5/2007 | Yamaguchi et al. |
| 2007/0125937 A1 | 6/2007 | Eliasson et al. |
| 2007/0152985 A1 | 7/2007 | Ostergaard et al. |
| 2007/0201042 A1 | 8/2007 | Eliasson et al. |
| 2007/0296688 A1 | 12/2007 | Nakamura et al. |
| 2008/0006766 A1 | 1/2008 | Oon et al. |
| 2008/0007540 A1 | 1/2008 | Ostergaard |
| 2008/0007541 A1 | 1/2008 | Eliasson et al. |
| 2008/0007542 A1 | 1/2008 | Eliasson et al. |
| 2008/0011944 A1 | 1/2008 | Chua et al. |
| 2008/0029691 A1 | 2/2008 | Han |
| 2008/0036743 A1 | 2/2008 | Westerman et al. |
| 2008/0062150 A1 | 3/2008 | Lee |
| 2008/0068691 A1 | 3/2008 | Miyatake |
| 2008/0074401 A1 | 3/2008 | Chung et al. |
| 2008/0088603 A1 | 4/2008 | Eliasson et al. |
| 2008/0121442 A1 | 5/2008 | Boer et al. |
| 2008/0122792 A1 | 5/2008 | Izadi et al. |
| 2008/0122803 A1 | 5/2008 | Izadi et al. |
| 2008/0130979 A1 | 6/2008 | Run et al. |
| 2008/0150846 A1 | 6/2008 | Chung et al. |
| 2008/0150848 A1 | 6/2008 | Chung et al. |
| 2008/0151126 A1 | 6/2008 | Yu |
| 2008/0158176 A1 | 7/2008 | Land et al. |
| 2008/0189046 A1 | 8/2008 | Eliasson et al. |
| 2008/0192025 A1 | 8/2008 | Jaeger et al. |
| 2008/0238433 A1 | 10/2008 | Joutsenoja et al. |
| 2008/0246388 A1 | 10/2008 | Cheon et al. |
| 2008/0252619 A1 | 10/2008 | Crockett et al. |
| 2008/0266266 A1 | 10/2008 | Kent et al. |
| 2008/0278460 A1 | 11/2008 | Arnett et al. |
| 2008/0284925 A1 | 11/2008 | Han |
| 2008/0291668 A1 | 11/2008 | Aylward et al. |
| 2008/0297482 A1 | 12/2008 | Weiss |

(56) References Cited

U.S. PATENT DOCUMENTS

| | | |
|---|---|---|
| 2009/0002340 A1 | 1/2009 | Van Genechten |
| 2009/0006292 A1 | 1/2009 | Block |
| 2009/0040786 A1 | 2/2009 | Mori |
| 2009/0066647 A1 | 3/2009 | Kerr et al. |
| 2009/0067178 A1 | 3/2009 | Huang et al. |
| 2009/0073142 A1 | 3/2009 | Yamashita et al. |
| 2009/0077501 A1 | 3/2009 | Partridge et al. |
| 2009/0085894 A1 | 4/2009 | Gandhi et al. |
| 2009/0091554 A1 | 4/2009 | Keam |
| 2009/0115919 A1 | 5/2009 | Tanaka et al. |
| 2009/0122020 A1 | 5/2009 | Eliasson et al. |
| 2009/0128508 A1 | 5/2009 | Sohn et al. |
| 2009/0135162 A1 | 5/2009 | Van De Wijdeven et al. |
| 2009/0143141 A1 | 6/2009 | Wells et al. |
| 2009/0153519 A1* | 6/2009 | Suarez Rovere ..... G06F 3/0421 345/173 |
| 2009/0161026 A1 | 6/2009 | Wu et al. |
| 2009/0168459 A1 | 7/2009 | Holman et al. |
| 2009/0187842 A1 | 7/2009 | Collins et al. |
| 2009/0189857 A1 | 7/2009 | Benko et al. |
| 2009/0189874 A1 | 7/2009 | Chene et al. |
| 2009/0189878 A1 | 7/2009 | Goertz et al. |
| 2009/0219256 A1 | 9/2009 | Newton |
| 2009/0229892 A1 | 9/2009 | Fisher et al. |
| 2009/0251439 A1 | 10/2009 | Westerman et al. |
| 2009/0256817 A1 | 10/2009 | Perlin et al. |
| 2009/0259967 A1 | 10/2009 | Davidson et al. |
| 2009/0267919 A1 | 10/2009 | Chao et al. |
| 2009/0273794 A1 | 11/2009 | Østergaard et al. |
| 2009/0278816 A1 | 11/2009 | Colson |
| 2009/0297009 A1 | 12/2009 | Xu et al. |
| 2010/0033444 A1 | 2/2010 | Kobayashi |
| 2010/0045629 A1 | 2/2010 | Newton |
| 2010/0060896 A1 | 3/2010 | Van De Wijdeven et al. |
| 2010/0066016 A1 | 3/2010 | Van De Wijdeven et al. |
| 2010/0066704 A1 | 3/2010 | Kasai |
| 2010/0073318 A1 | 3/2010 | Hu et al. |
| 2010/0078545 A1 | 4/2010 | Leong et al. |
| 2010/0079407 A1 | 4/2010 | Suggs et al. |
| 2010/0079408 A1 | 4/2010 | Leong et al. |
| 2010/0097345 A1 | 4/2010 | Jang et al. |
| 2010/0097348 A1 | 4/2010 | Park et al. |
| 2010/0097353 A1 | 4/2010 | Newton |
| 2010/0125438 A1 | 5/2010 | Audet |
| 2010/0127975 A1 | 5/2010 | Jensen |
| 2010/0134435 A1 | 6/2010 | Kimura et al. |
| 2010/0142823 A1 | 6/2010 | Wang et al. |
| 2010/0187422 A1 | 7/2010 | Kothari et al. |
| 2010/0193259 A1 | 8/2010 | Wassvik |
| 2010/0229091 A1 | 9/2010 | Homma et al. |
| 2010/0238139 A1 | 9/2010 | Goertz et al. |
| 2010/0245292 A1 | 9/2010 | Wu |
| 2010/0265170 A1 | 10/2010 | Norieda |
| 2010/0277436 A1 | 11/2010 | Feng et al. |
| 2010/0283785 A1 | 11/2010 | Satulovsky |
| 2010/0284596 A1 | 11/2010 | Miao et al. |
| 2010/0289754 A1 | 11/2010 | Sleeman et al. |
| 2010/0295821 A1 | 11/2010 | Chang et al. |
| 2010/0302196 A1 | 12/2010 | Han et al. |
| 2010/0302209 A1 | 12/2010 | Large |
| 2010/0302210 A1 | 12/2010 | Han et al. |
| 2010/0302240 A1 | 12/2010 | Lettvin |
| 2010/0315379 A1 | 12/2010 | Allard et al. |
| 2010/0321328 A1 | 12/2010 | Chang et al. |
| 2010/0322550 A1 | 12/2010 | Trott |
| 2011/0043490 A1 | 2/2011 | Powell et al. |
| 2011/0049388 A1 | 3/2011 | Delaney et al. |
| 2011/0050649 A1 | 3/2011 | Newton et al. |
| 2011/0051394 A1 | 3/2011 | Bailey |
| 2011/0068256 A1 | 3/2011 | Hong et al. |
| 2011/0069039 A1 | 3/2011 | Lee et al. |
| 2011/0069807 A1 | 3/2011 | Dennerlein et al. |
| 2011/0074725 A1 | 3/2011 | Westerman et al. |
| 2011/0074734 A1 | 3/2011 | Wassvik et al. |
| 2011/0074735 A1 | 3/2011 | Wassvik et al. |
| 2011/0090176 A1 | 4/2011 | Christiansson et al. |
| 2011/0102374 A1 | 5/2011 | Wassvik et al. |
| 2011/0115748 A1 | 5/2011 | Xu |
| 2011/0121323 A1 | 5/2011 | Wu et al. |
| 2011/0122075 A1 | 5/2011 | Seo et al. |
| 2011/0122091 A1 | 5/2011 | King et al. |
| 2011/0122094 A1 | 5/2011 | Tsang et al. |
| 2011/0134079 A1 | 6/2011 | Stark |
| 2011/0147569 A1 | 6/2011 | Drumm |
| 2011/0157095 A1 | 6/2011 | Drumm |
| 2011/0157096 A1 | 6/2011 | Drumm |
| 2011/0163996 A1 | 7/2011 | Wassvik et al. |
| 2011/0163997 A1 | 7/2011 | Kim |
| 2011/0163998 A1 | 7/2011 | Goertz et al. |
| 2011/0169780 A1 | 7/2011 | Goertz et al. |
| 2011/0175852 A1 | 7/2011 | Goertz et al. |
| 2011/0205186 A1 | 8/2011 | Newton et al. |
| 2011/0216042 A1 | 9/2011 | Wassvik et al. |
| 2011/0221705 A1 | 9/2011 | Yi et al. |
| 2011/0221997 A1 | 9/2011 | Kim et al. |
| 2011/0227036 A1 | 9/2011 | Vaufrey |
| 2011/0227874 A1 | 9/2011 | Fåhraeus et al. |
| 2011/0234537 A1 | 9/2011 | Kim et al. |
| 2011/0254864 A1 | 10/2011 | Tsuchikawa et al. |
| 2011/0261020 A1 | 10/2011 | Song et al. |
| 2011/0267296 A1 | 11/2011 | Noguchi et al. |
| 2011/0291989 A1 | 12/2011 | Lee |
| 2011/0298743 A1 | 12/2011 | Machida et al. |
| 2011/0309325 A1 | 12/2011 | Park et al. |
| 2011/0310045 A1 | 12/2011 | Toda et al. |
| 2012/0019448 A1 | 1/2012 | Pitkanen et al. |
| 2012/0026408 A1 | 2/2012 | Lee et al. |
| 2012/0038593 A1 | 2/2012 | Rönkä et al. |
| 2012/0062474 A1 | 3/2012 | Weishaupt et al. |
| 2012/0068973 A1 | 3/2012 | Christiansson et al. |
| 2012/0086673 A1 | 4/2012 | Chien et al. |
| 2012/0089348 A1 | 4/2012 | Perlin et al. |
| 2012/0110447 A1 | 5/2012 | Chen |
| 2012/0131490 A1 | 5/2012 | Lin et al. |
| 2012/0141001 A1 | 6/2012 | Zhang et al. |
| 2012/0146930 A1 | 6/2012 | Lee |
| 2012/0153134 A1 | 6/2012 | Bergström et al. |
| 2012/0154338 A1 | 6/2012 | Bergström et al. |
| 2012/0162142 A1 | 6/2012 | Christiansson et al. |
| 2012/0162144 A1 | 6/2012 | Fåhraeus et al. |
| 2012/0169672 A1 | 7/2012 | Christiansson |
| 2012/0181419 A1 | 7/2012 | Momtahan |
| 2012/0182266 A1 | 7/2012 | Han |
| 2012/0188206 A1 | 7/2012 | Sparf et al. |
| 2012/0191993 A1 | 7/2012 | Drader et al. |
| 2012/0200532 A1 | 8/2012 | Powell et al. |
| 2012/0200538 A1 | 8/2012 | Christiansson et al. |
| 2012/0212441 A1 | 8/2012 | Christiansson et al. |
| 2012/0217882 A1 | 8/2012 | Wong et al. |
| 2012/0249478 A1 | 10/2012 | Chang et al. |
| 2012/0256882 A1 | 10/2012 | Christiansson et al. |
| 2012/0268403 A1 | 10/2012 | Christiansson |
| 2012/0268427 A1 | 10/2012 | Slobodin |
| 2012/0274559 A1 | 11/2012 | Mathai et al. |
| 2012/0305755 A1 | 12/2012 | Hong et al. |
| 2013/0021300 A1 | 1/2013 | Wassvik |
| 2013/0021302 A1 | 1/2013 | Drumm |
| 2013/0027404 A1 | 1/2013 | Sarnoff |
| 2013/0044073 A1 | 2/2013 | Christiansson et al. |
| 2013/0055080 A1 | 2/2013 | Komer et al. |
| 2013/0076697 A1 | 3/2013 | Goertz et al. |
| 2013/0082980 A1 | 4/2013 | Gruhlke et al. |
| 2013/0107569 A1 | 5/2013 | Suganuma |
| 2013/0113715 A1 | 5/2013 | Grant et al. |
| 2013/0120320 A1 | 5/2013 | Liu et al. |
| 2013/0125016 A1 | 5/2013 | Pallakoff et al. |
| 2013/0127790 A1 | 5/2013 | Wassvik |
| 2013/0135258 A1 | 5/2013 | King et al. |
| 2013/0135259 A1 | 5/2013 | King et al. |
| 2013/0141388 A1 | 6/2013 | Ludwig et al. |
| 2013/0154983 A1 | 6/2013 | Christiansson et al. |
| 2013/0155027 A1 | 6/2013 | Holmgren et al. |
| 2013/0181896 A1 | 7/2013 | Gruhlke et al. |
| 2013/0187891 A1 | 7/2013 | Eriksson et al. |

(56) References Cited

U.S. PATENT DOCUMENTS

| | | |
|---|---|---|
| 2013/0201142 A1 | 8/2013 | Suarez Rovere |
| 2013/0222346 A1 | 8/2013 | Chen et al. |
| 2013/0241887 A1 | 9/2013 | Sharma |
| 2013/0249833 A1 | 9/2013 | Christiansson et al. |
| 2013/0269867 A1 | 10/2013 | Trott |
| 2013/0275082 A1 | 10/2013 | Follmer et al. |
| 2013/0285920 A1 | 10/2013 | Colley |
| 2013/0285968 A1 | 10/2013 | Christiansson et al. |
| 2013/0300716 A1 | 11/2013 | Craven-Bartle et al. |
| 2013/0307795 A1 | 11/2013 | Suarez Rovere |
| 2013/0342490 A1 | 12/2013 | Wallander et al. |
| 2014/0002400 A1 | 1/2014 | Christiansson et al. |
| 2014/0028575 A1 | 1/2014 | Parivar et al. |
| 2014/0028604 A1 | 1/2014 | Morinaga et al. |
| 2014/0028629 A1 | 1/2014 | Drumm et al. |
| 2014/0036203 A1 | 2/2014 | Guillou et al. |
| 2014/0055421 A1 | 2/2014 | Christiansson et al. |
| 2014/0063853 A1 | 3/2014 | Nichol et al. |
| 2014/0071653 A1 | 3/2014 | Thompson et al. |
| 2014/0085241 A1 | 3/2014 | Christiansson et al. |
| 2014/0092052 A1 | 4/2014 | Grunthaner et al. |
| 2014/0098032 A1 | 4/2014 | Ng et al. |
| 2014/0098058 A1 | 4/2014 | Baharav et al. |
| 2014/0109219 A1 | 4/2014 | Rohrweck et al. |
| 2014/0125633 A1 | 5/2014 | Fåhraeus et al. |
| 2014/0139467 A1* | 5/2014 | Ghosh ............ G06F 3/0416 345/173 |
| 2014/0160762 A1 | 6/2014 | Dudik et al. |
| 2014/0192023 A1 | 7/2014 | Hoffman |
| 2014/0232669 A1 | 8/2014 | Ohlsson et al. |
| 2014/0237401 A1 | 8/2014 | Krus et al. |
| 2014/0237408 A1 | 8/2014 | Ohlsson et al. |
| 2014/0237422 A1 | 8/2014 | Ohlsson et al. |
| 2014/0253831 A1 | 9/2014 | Craven-Bartle |
| 2014/0267124 A1 | 9/2014 | Christiansson et al. |
| 2014/0292701 A1 | 10/2014 | Christiansson et al. |
| 2014/0300572 A1 | 10/2014 | Ohlsson et al. |
| 2014/0320460 A1 | 10/2014 | Johansson et al. |
| 2014/0347325 A1 | 11/2014 | Wallander et al. |
| 2014/0362046 A1 | 12/2014 | Yoshida |
| 2014/0368471 A1 | 12/2014 | Christiansson et al. |
| 2014/0375607 A1 | 12/2014 | Christiansson et al. |
| 2015/0002386 A1 | 1/2015 | Mankowski et al. |
| 2015/0015497 A1 | 1/2015 | Leigh |
| 2015/0035774 A1 | 2/2015 | Christiansson et al. |
| 2015/0035803 A1 | 2/2015 | Wassvik et al. |
| 2015/0053850 A1 | 2/2015 | Uvnäs |
| 2015/0054759 A1 | 2/2015 | Christiansson et al. |
| 2015/0083891 A1 | 3/2015 | Wallander |
| 2015/0103013 A9 | 4/2015 | Huang |
| 2015/0130769 A1 | 5/2015 | Björklund |
| 2015/0138105 A1 | 5/2015 | Christiansson et al. |
| 2015/0138158 A1 | 5/2015 | Wallander et al. |
| 2015/0138161 A1 | 5/2015 | Wassvik |
| 2015/0205441 A1 | 7/2015 | Bergström et al. |
| 2015/0215450 A1 | 7/2015 | Seo et al. |
| 2015/0242055 A1 | 8/2015 | Wallander |
| 2015/0317036 A1 | 11/2015 | Johansson et al. |
| 2015/0324028 A1 | 11/2015 | Wassvik et al. |
| 2015/0331544 A1 | 11/2015 | Bergström et al. |
| 2015/0331545 A1 | 11/2015 | Wassvik et al. |
| 2015/0331546 A1 | 11/2015 | Craven-Bartle et al. |
| 2015/0331547 A1 | 11/2015 | Wassvik et al. |
| 2015/0332655 A1 | 11/2015 | Krus et al. |
| 2015/0346856 A1 | 12/2015 | Wassvik |
| 2015/0346911 A1 | 12/2015 | Christiansson |
| 2015/0363042 A1 | 12/2015 | Krus et al. |
| 2016/0026337 A1 | 1/2016 | Wassvik et al. |
| 2016/0034099 A1 | 2/2016 | Christiansson et al. |
| 2016/0050746 A1 | 2/2016 | Wassvik et al. |
| 2016/0070415 A1 | 3/2016 | Christiansson et al. |
| 2016/0070416 A1 | 3/2016 | Wassvik |
| 2016/0124546 A1 | 5/2016 | Chen et al. |
| 2016/0124551 A1 | 5/2016 | Christiansson et al. |
| 2016/0154531 A1 | 6/2016 | Wall |
| 2016/0154532 A1* | 6/2016 | Campbell ............ G06F 3/042 345/175 |
| 2016/0202841 A1 | 7/2016 | Christiansson et al. |
| 2016/0216844 A1 | 7/2016 | Bergström |
| 2016/0224144 A1 | 8/2016 | Klinghult et al. |
| 2016/0299593 A1 | 10/2016 | Christiansson et al. |
| 2016/0328090 A1 | 11/2016 | Klinghult |
| 2016/0328091 A1 | 11/2016 | Wassvik et al. |
| 2016/0334942 A1 | 11/2016 | Wassvik |
| 2016/0342282 A1 | 11/2016 | Wassvik |
| 2016/0357348 A1 | 12/2016 | Wallander |
| 2017/0010688 A1 | 1/2017 | Fahraeus et al. |
| 2017/0090090 A1 | 3/2017 | Craven-Bartle et al. |
| 2017/0102827 A1 | 4/2017 | Christiansson et al. |
| 2017/0115235 A1 | 4/2017 | Ohlsson et al. |
| 2017/0139541 A1 | 5/2017 | Christiansson et al. |
| 2017/0177163 A1 | 6/2017 | Wallander et al. |
| 2017/0185230 A1 | 6/2017 | Wallander et al. |

FOREIGN PATENT DOCUMENTS

| | | |
|---|---|---|
| CN | 201437963 U | 4/2010 |
| CN | 101019071 B | 6/2012 |
| CN | 101206550 B | 6/2012 |
| CN | 101075168 B | 4/2014 |
| DE | 3511330 C2 | 5/1988 |
| DE | 68902419 T2 | 3/1993 |
| DE | 69000920 T2 | 6/1993 |
| DE | 19809934 A1 | 9/1999 |
| DE | 10026201 A1 | 12/2000 |
| DE | 102010000473 A1 | 8/2010 |
| EP | 0845812 B1 | 6/1998 |
| EP | 0600576 B1 | 10/1998 |
| EP | 1798630 A2 | 6/2007 |
| EP | 0897161 B1 | 10/2007 |
| EP | 2088501 A1 | 8/2009 |
| EP | 1512989 B1 | 9/2009 |
| EP | 2077490 A3 | 1/2010 |
| EP | 1126236 B1 | 12/2010 |
| EP | 2314203 A1 | 4/2011 |
| EP | 2339437 A3 | 10/2011 |
| EP | 2442180 A1 | 4/2012 |
| EP | 2466429 A1 | 6/2012 |
| EP | 2479642 A1 | 7/2012 |
| EP | 1457870 B1 | 8/2012 |
| FR | 2172828 A1 | 10/1973 |
| FR | 2617619 B1 | 1/1990 |
| FR | 2614711 B1 | 3/1992 |
| FR | 2617620 B1 | 9/1992 |
| FR | 2676275 A1 | 11/1992 |
| GB | 1380144 A | 1/1975 |
| GB | 2131544 B | 3/1986 |
| GB | 2204126 A | 11/1988 |
| JP | 2000506655 A | 5/2000 |
| JP | 2000172438 A | 6/2000 |
| JP | 2000259334 A | 9/2000 |
| JP | 2000293311 A | 10/2000 |
| JP | 2003330603 A | 11/2003 |
| JP | 2005004278 A | 1/2005 |
| JP | 2008506173 A | 2/2008 |
| JP | 2011530124 A | 12/2011 |
| KR | 100359400 | 7/2001 |
| KR | 100940435 | 2/2010 |
| WO | WO 1984/003186 A1 | 8/1984 |
| WO | WO 1999/046602 A1 | 9/1999 |
| WO | WO 01/127867 A1 | 4/2001 |
| WO | WO 01/84251 A2 | 11/2001 |
| WO | WO 02/35460 A1 | 5/2002 |
| WO | WO 02/077915 A2 | 10/2002 |
| WO | WO 02/095668 A1 | 11/2002 |
| WO | WO 03/076870 A1 | 9/2003 |
| WO | WO 2004/081502 A2 | 9/2004 |
| WO | WO 2004/081956 A2 | 9/2004 |
| WO | WO 2005/026938 A2 | 3/2005 |
| WO | WO 2005/029172 A2 | 3/2005 |
| WO | WO 2005/029395 A2 | 3/2005 |
| WO | WO 2005/125011 A1 | 12/2005 |
| WO | WO 2006/095320 A2 | 9/2006 |
| WO | WO 2006/124551 A2 | 11/2006 |

(56) References Cited

FOREIGN PATENT DOCUMENTS

| | | |
|---|---|---|
| WO | WO 2007/003196 A2 | 1/2007 |
| WO | WO 2007/058924 A2 | 5/2007 |
| WO | WO 2007/112742 A1 | 10/2007 |
| WO | WO 2008/004103 A2 | 1/2008 |
| WO | WO 2008/007276 A2 | 1/2008 |
| WO | WO 2008/017077 A2 | 2/2008 |
| WO | WO 2008/039006 A1 | 4/2008 |
| WO | WO 2008/068607 A2 | 6/2008 |
| WO | WO 2006/124551 B1 | 7/2008 |
| WO | WO 2008/017077 A4 | 2/2009 |
| WO | WO 2009/048365 A1 | 4/2009 |
| WO | WO 2009/077962 A2 | 6/2009 |
| WO | WO 2009/102681 A2 | 8/2009 |
| WO | WO 2009/137355 A2 | 11/2009 |
| WO | WO 2010/006883 | 1/2010 |
| WO | WO 2010/006883 A2 | 1/2010 |
| WO | WO 2010/006884 A2 | 1/2010 |
| WO | WO 2010/006885 A2 | 1/2010 |
| WO | WO 2010/006886 A2 | 1/2010 |
| WO | WO 2010/015408 A1 | 2/2010 |
| WO | WO 2010/046539 A1 | 4/2010 |
| WO | WO 2010/056177 A1 | 5/2010 |
| WO | WO 2010/064983 | 6/2010 |
| WO | WO 2010/081702 A2 | 7/2010 |
| WO | WO 2010/112404 A1 | 10/2010 |
| WO | WO 2010/123809 A2 | 10/2010 |
| WO | WO 2010/134865 A1 | 11/2010 |
| WO | WO 2011/028169 A1 | 3/2011 |
| WO | WO 2011/028170 A1 | 3/2011 |
| WO | WO 2011/049511 A1 | 4/2011 |
| WO | WO 2011/049512 A1 | 4/2011 |
| WO | WO 2011/049513 A1 | 4/2011 |
| WO | WO 2011/057572 A1 | 5/2011 |
| WO | WO 2011/078769 A1 | 6/2011 |
| WO | WO 2011/082477 A1 | 7/2011 |
| WO | WO 2011/139213 A1 | 11/2011 |
| WO | WO 2012/002894 A1 | 1/2012 |
| WO | WO 2012/010078 A1 | 1/2012 |
| WO | WO 2012/050510 A1 | 4/2012 |
| WO | WO 2012/082055 A1 | 6/2012 |
| WO | WO 2012/105893 A1 | 8/2012 |
| WO | WO 2012/121652 A1 | 9/2012 |
| WO | WO 2012/158105 A2 | 11/2012 |
| WO | WO 2012/172302 | 12/2012 |
| WO | WO 2012/176801 A1 | 12/2012 |
| WO | WO 2013/036192 A1 | 3/2013 |
| WO | WO 2013/048312 A2 | 4/2013 |
| WO | WO 2013/055282 A2 | 4/2013 |
| WO | WO 2013/062471 A2 | 5/2013 |
| WO | WO 2013/089622 A2 | 6/2013 |
| WO | WO 2013/133756 A1 | 9/2013 |
| WO | WO 2013/133757 A2 | 9/2013 |
| WO | WO 2013/176613 A2 | 11/2013 |
| WO | WO 2013/176614 A2 | 11/2013 |
| WO | WO 2013/176615 A2 | 11/2013 |
| WO | WO 2014/055809 A1 | 4/2014 |

OTHER PUBLICATIONS

Chou, N., et al., "Generalized pseudo-polar Fourier grids and applications in regfersting optical coherence tomography images," 43rd Asilomar Conference on Signals, Systems and Computers, Nov. 2009, in 5 pages.

Fihn, M., "Touch Panel—Special Edition," Veritas et Visus, Nov. 2011, in 1 page.

Fourmont, K., "Non-Equispaced Fast Fourier Transforms with Applications to Tomography," Journal of Fourier Analysis and Applications, vol. 9, Issue 5, 2003, in 20 pages.

Iizuka, K., "Boundaries, Near-Field Optics, and Near-Field Imaging," Elements of Photonics, vol. 1: In Free Space and Special Media, Wiley & Sons, 2002, in 57 pages.

Johnson, M., "Enhanced Optical Touch Input Panel", IBM Technical Disclousre Bulletin, 1985, in 3 pages.

Kak, et al., "Principles of Computerized Tomographic Imaging", Institute of Electrical Engineers, Inc., 1999, in 333 pages.

The Laser Wall, MIT, 1997, http://web.media.mit.edu/~joep/SpectrumWeb/captions/Laser.html.

Liu, J., et al. "Multiple touch points identifying method, involves starting touch screen, driving specific emission tube, and computing and transmitting coordinate of touch points to computer system by direct lines through interface of touch screen," 2007, in 25 pages.

Natterer, F., "The Mathematics of Computerized Tomography", Society for Industrial and Applied Mathematics, 2001, in 240 pages.

Natterer, F., et al. "Fourier Reconstruction," Mathematical Methods in Image Reconstruction, Society for Industrial and Applied Mathematics, 2001, in 12 pages.

Paradiso, J.A., "Several Sensor Approaches that Retrofit Large Surfaces for Interactivity," ACM Ubicomp 2002 Workshop on Collaboration with Interactive Walls and Tables, 2002, in 8 pages.

Tedaldi, M., et al. "Refractive index mapping of layered samples using optical coherence refractometry," Proceedings of SPIE, vol. 7171, 2009, in 8 pages.

* cited by examiner

A - - A

A - - A

LIGHT COUPLING IN TIR-BASED OPTICAL TOUCH SYSTEMS

CROSS-REFERENCE TO RELATED APPLICATIONS

This application claims the benefit and priority to and is a U.S. National Phase of PCT International Application Number PCT/SE2015/050043, filed on Jan. 16, 2015. This application claims the benefit and priority to Swedish patent application No. 1450038-3, filed 16 Jan. 2014. The disclosure of the above-referenced applications are hereby expressly incorporated by reference in their entirety.

TECHNICAL FIELD

The present invention generally relates to optical touch-sensing systems, and in particular to such systems that operate by projection measurements of light that propagates by total internal reflection (TIR) inside a light transmissive panel.

BACKGROUND ART

Touch-sensing systems ("touch systems") are in widespread use in a variety of applications. Typically, the touch systems are actuated by a touching object such as a finger or stylus, either in direct contact, or through proximity (i.e. without contact), with a touch surface. Touch systems are for example used as touch pads of laptop computers, in control panels, and as overlays to displays on e.g. hand held devices, such as mobile telephones. A touch panel that is overlaid on or integrated in a display is also denoted a "touch screen". Many other applications are known in the art.

There are numerous known techniques for providing touch sensitivity, e.g. by incorporating resistive wire grids, capacitive sensors, strain gauges, etc into a touch panel. There are also various types of optical touch systems, which e.g. detect shadows cast by touching objects onto a touch surface, or detect light scattered off the point(s) of touching objects on a touch panel.

One specific type of optical touch system uses projection measurements of light that propagates on a plurality of propagation paths inside a light transmissive panel that defines a touch surface. The projection measurements thus quantify a property, e.g. power, of the light on the individual propagation paths, when the light has passed the panel. The light propagates inside the panel by total internal reflection (TIR) against the touch surface, such that objects on the touch surface causes the propagating light on one or more propagation paths to be attenuated, commonly denoted FTIR (Frustrated Total Internal Reflection). For touch determination, the projection measurements may be processed by simple triangulation, or by more advanced image reconstruction techniques that generate a two-dimensional distribution of disturbances on the touch surface, i.e. an "image" of everything on the touch surface that affects the measured property. Examples of such touch systems are found in U.S. Pat. No. 3,673,327, U.S. Pat. No. 4,254,333, U.S. Pat. No. 6,972,753, U.S. Pat. No. 7,432,893, US2006/0114237, US2007/0075648, WO2009/048365, US2009/0153519, WO2010/006882, WO2010/064983, WO2010/134865 and WO2012/105893.

The prior art suggests several different approaches for introducing the light into the panel and for detecting the light downstream of the touch surface. For example, U.S. Pat. No. 7,432,893 proposes coupling light into the panel via revolved prisms that are attached to the rear surface of the panel, and detecting the light at photodetectors that are directly attached to the front surface of panel. In WO2010/064983, light is coupled into and out of the panel via the edge surface that connects the front and rear surfaces of the panel, or via wedges that are attached to the front or rear surface of the panel. In WO2012/105893, a sheet-like microstructured element, e.g. a tape of light transmissive material, is provided on the front or rear surface of the panel for coupling light into and out of the panel.

One challenge when designing an optical touch system of this type is to enable consistent touch determination despite the fact that the detectors need to detect small changes in weak optical signals in presence of potentially significant interferences that affect the reliability of the optical signals. One such interference is caused by ambient light, e.g. from sunlight or residential lighting, that may impinge on the detectors and influence the optical signals. Another interference is caused by accumulation of contamination on the touch surface, such a fingerprints, drops of saliva, sweat, smear, liquid spills, etc. The contamination will interact with the propagating light and cause changes to the optical signals that may be difficult to distinguish from changes caused by "true objects", e.g. objects that are actively manipulated in contact with the touch surface.

In aforesaid U.S. Pat. No. 7,432,893, the impact of ambient light is reduced by attaching the photodetectors to the front surface, such that the photodetectors face away from the ambient light that enters the panel through the front surface. This solution requires a significant bezel to hide and protect the photodetectors and the associated wiring. U.S. Pat. No. 7,432,893 also proposes to intermittently measure ambient levels at the photodetectors and compensate the respective projection measurement for the measured ambient level.

The influence of contamination may be handled by dedicated signal processing that actively estimates the influence of contamination over time and compensates for this influence, e.g. as disclosed in WO2011/028169, WO2011/049512 and WO2012/121652.

However, in view of the weak optical signals and small attenuation caused by touching objects, there is room for further improvement when it comes to increasing the efficiency of touch system.

SUMMARY

It is an objective of the invention to at least partly overcome one or more of the above-identified limitations of the prior art. This object is fulfilled by means of a touch-sensitive apparatus configured in accordance with the claims, which provides an improved light budget by specifically spreading light as needed, in combination with a suitable light source for the emitter.

A first aspect of the invention relates to a touch-sensitive apparatus, comprising: a light transmissive panel that defines a front surface and an opposite, rear surface; at least one light emitter optically connected to the panel so as to generate light that propagates by total internal reflection inside the panel across a touch-sensitive region on the panel; wherein said light emitter is a VCSEL array including a number of VCSELs driven to collectively form one light emitter; a light coupling mechanism connecting the emitter to the panel, configured to give light from a plurality of the VCSELs in the VCSEL array substantially the same spread in the panel; and at least one light detector optically connected to the panel to receive propagating light from the emitter.

In one embodiment, said light coupling mechanism is configured to direct light from a plurality of the VCSELs of the array to impinge on the front surface at a substantially common predetermined angle (θ) of incidence from within the panel.

In one embodiment, said light coupling mechanism is configured to give light from a plurality of the VCSELs of the array a substantially common fan-shaped spread horizontally within the panel.

In one embodiment, said light coupling mechanism includes a plurality of beam-deflecting elements configured to spread light emanating from the VCSELs of the emitter.

In one embodiment, said light coupling mechanism includes one beam-deflecting element for each VCSEL of the emitter.

In one embodiment, said light coupling mechanism includes one beam-deflecting element for a subset of the number of VCSELs of the emitter, which subset of VCSELs are arranged along a column perpendicular to the front surface of the panel.

In one embodiment, said beam-deflecting elements comprises reflecting elements.

In one embodiment, said beam-deflecting elements comprises refracting elements.

In one embodiment, said beam-deflecting elements are arranged in a layer over the VCSEL array.

In one embodiment, said beam-deflecting elements are staggered over the VCSEL array.

In one embodiment, each beam-deflecting element is a substantially cylindrical convex mirror having a cylinder axis arranged at an angle to a general output beam direction of said VCSELs.

In one embodiment, said light coupling mechanism comprises a layer having a diffractive beam-deflecting pattern configured to deflect light from each VCSEL of the array.

In one embodiment, said emitter is connected to the rear surface of the panel via said light coupling mechanism.

In one embodiment, the touch-sensitive apparatus comprises a visibility filter between the emitter and the rear surface of the panel.

In one embodiment, the plurality of VCSELs of said emitter are connected to be driven in parallel.

In one embodiment the touch-sensitive apparatus comprises a plurality of spaced apart emitters spaced apart so as to define a grid of propagation paths across the touch-sensitive region between respective pairs of one light emitter and one light detector, where each emitter is a separate VCSEL array.

In one embodiment the touch-sensitive apparatus comprises a plurality of spaced apart detectors so as to define a grid of propagation paths across the touch-sensitive region between respective pairs of one light emitter and one light detector.

In one embodiment, a bandpass filter, tailored to an operating wavelength for said VCSELs, is arranged at said detector.

In one embodiment said bandpass filter has a bandwidth of less than 5 nm.

In one embodiment said light detector is optically connected to the light transmissive panel via an angular filter which is applied to an outcoupling region of the panel and is configured to transmit the propagating light only within a confined range of angles with respect to the normal of the outcoupling region; and wherein said light coupling mechanism is configured to control light input into the panel such that it reaches the outcoupling region predominantly within said confined range of angles.

In one embodiment the confined range extends from a lower angle limit $θ_{min}$ to an upper angle limit $θ_{max}$, wherein the lower angle limit $θ_{min}$ is equal to or larger than a critical angle $θ_c$, which is given by $θ_c=\arc\sin(1/n_{panel})$, with $n_{panel}$ being the refractive index of the light transmissive panel (1) at the outcoupling region.

In one embodiment the lower angle limit $θ_{min}$ exceeds the critical angle by an angle $Δθ$, which is at least 5°, 10° or 15°.

In one embodiment the lower angle limit $θ_{min}$ is equal to or larger than a first cut-off angle $θ_w=\arc\sin(n_w/n_{panel})$, with $n_w$ being the refractive index of water, $n_{panel}>n_w$.

In one embodiment the lower angle limit $θ_{min}$ is equal to or larger than a second cut-off angle $θ_f=\arc\sin(n_f/n_{panel})$, with $n_f$ being the refractive index of finger fat, $n_{panel}>n_f$.

In one embodiment the angular filter includes a dielectric multilayer structure.

BRIEF DESCRIPTION OF DRAWINGS

Embodiments of the invention will now be described in more detail with reference to the accompanying schematic drawings.

DETAILED DESCRIPTION OF EXAMPLE EMBODIMENTS

Figure 1:
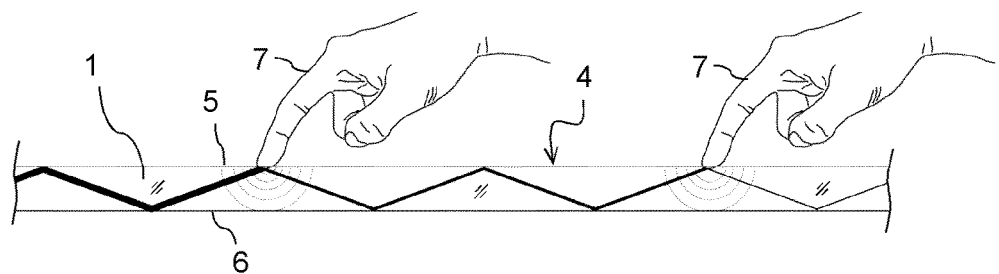
FIG. 1 is a section view of a light transmissive panel to illustrate the principle of using TIR for touch detection.

In the following, various inventive light coupling mechanism structures will be presented as installed in an exemplifying TIR-based projection-type touch-sensitive apparatus. Throughout the description, the same reference numerals are used to identify corresponding elements.

FIG. 1 illustrates the concept of touch detection based on attenuation of propagating light, commonly denoted FTIR (Frustrated Total Internal Reflection). According to this concept, light is transmitted inside a panel 1 along a plurality of well-defined propagation paths. The panel 1 is made of solid material in one or more layers and may have any shape. The panel 1 defines an internal radiation propagation channel, in which light propagates by internal reflections, also denoted "bounces" in the following. In the example of FIG. 1, the propagation channel is defined between the boundary surfaces 5, 6 of the panel 1, and the front surface 5 allows the propagating light to interact with touching objects 7 and thereby defines the touch surface 4. The interaction is enabled by injecting the light into the panel 1 such that the light is reflected by total internal reflection (TIR) in the front surface 5 as it propagates through the panel 1. The light may be reflected by TIR in the rear surface 6 or against a reflective coating thereon. It is also conceivable that the propagation channel is spaced from the rear surface 6, e.g. if the panel comprises multiple layers of different materials. The panel 1 may thus be made of any solid material (or combination of materials) that transmits a sufficient amount of light in the relevant wavelength range to permit a sensible measurement of transmitted energy. Such material includes glass, poly(methyl methacrylate) (PMMA) and polycarbonates (PC). The panel 1 typically has a refractive index in the range of 1.3-1.7. For example, PMMA has a refractive index of about 1.5 and PC has a refractive index of about 1.6 in the near infrared (NIR). The panel 1 may be designed to be overlaid on or integrated into a display device or monitor (not shown).

As shown in FIG. 1, an object 7 that is brought into close vicinity of, or in contact with, the touch surface 4 may interact with the propagating light at the point of touch. In this interaction, part of the light may be scattered by the object 7, part of the light may be absorbed by the object 7, and part of the light may continue to propagate in its original direction across the panel 1. Thus, the touching object 7 causes a local attenuation or "frustration" of the total internal reflection, which leads to a decrease in the energy (or equivalently, the power or intensity) of the transmitted light, as indicated by the thinned lines downstream of the touching objects 7 in FIG. 1.

Figure 2A:
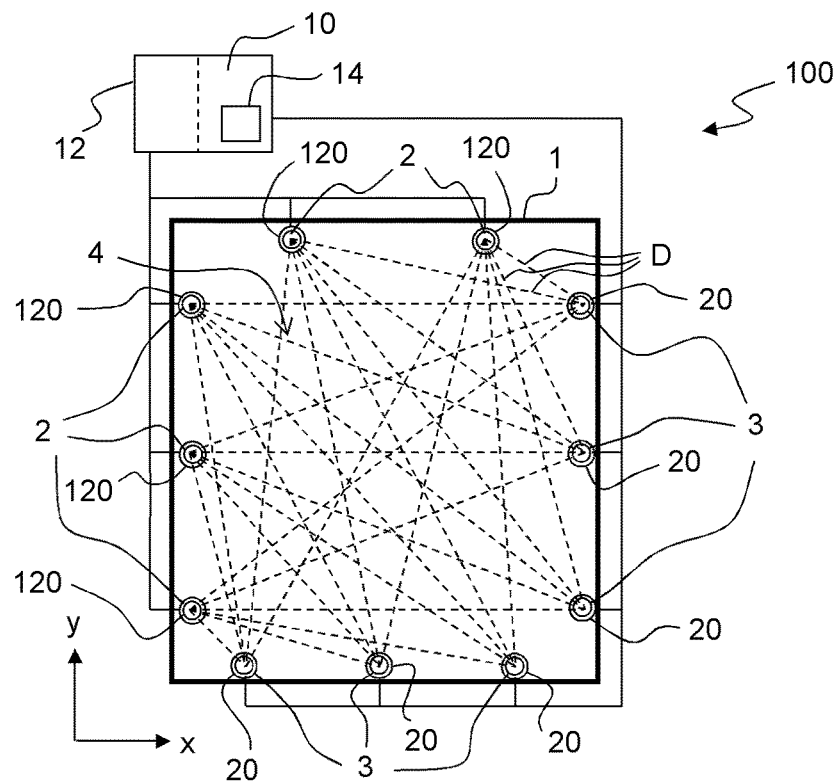
FIG. 2A is a top plan view of a touch-sensitive apparatus according to an embodiment.

FIG. 2A illustrates an example embodiment of a touch-sensitive apparatus 100 that is based on the concept of FTIR. Emitters 2 are distributed along the perimeter of the touch surface 4, beneath the panel 1, to project light onto an incoupling structure on the panel 1 such that at least part of the light is captured inside the panel 1 for propagation by internal reflections in the propagation channel. Detectors 3 are distributed along the perimeter of the touch surface 4, beneath the panel 1, and are optically coupled to the panel 1 so as to receive part of the propagating light from a respective outcoupling structure. The light from each emitter 2 will thereby propagate inside the panel 1 to a number of different detectors 3 on a plurality of light propagation paths D. Even if the light propagation paths D correspond to light that propagates by internal reflections inside the panel 1, the light propagation paths D may conceptually be represented as "detection lines" that extend across the touch surface 4 between pairs of emitters 2 and detectors 3, as indicated by dashed lines in FIG. 2A. Thus, the detection lines correspond to a projection of the propagation paths onto the touch surface 4. Thereby, the emitters 2 and detectors 3 collectively define a grid of detection lines ("detection grid") on the touch surface 4, as seen in a top plan view. It is appreciated that FIG. 2A is an example, and that a (significantly) larger number of emitters 2 and/or detectors 3 may be included in the apparatus 100. Also, the distribution of emitters 2 and detectors 3 may differ.

The detectors 3 collectively provide an output signal, which is received and sampled by a signal processor 10. The output signal contains a number of sub-signals, also denoted "projection signals", each representing the energy of light received by a certain light detector 3 from a certain light emitter 2. Depending on implementation, the signal processor 10 may need to process the output signal for separation of the individual projection signals. The projection signals represent the energy, intensity or power of light received by the detectors 3 on the individual detection lines D. Whenever an object touches a detection line, the received energy on this detection line is decreased or "attenuated".

Figure 2B:
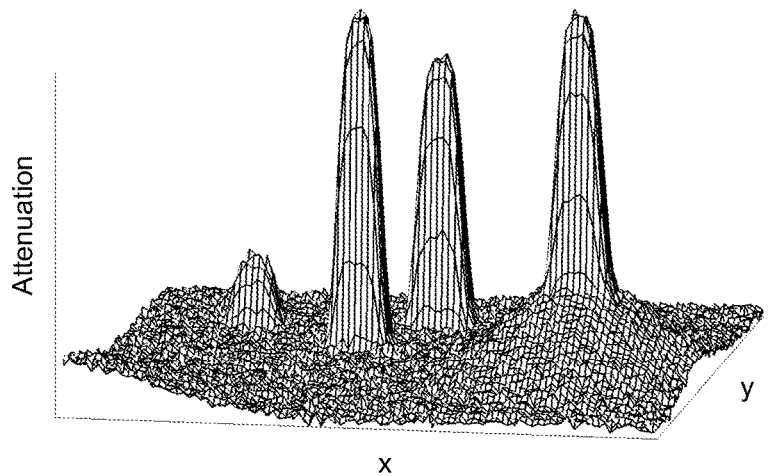
FIG. 2B is a 3D plot of an attenuation pattern generated based on energy signals from a TIR-based projection-type touch-sensitive apparatus.

The signal processor 10 may be configured to process the projection signals so as to determine a property of the touching objects, such as a position (e.g. in the x,y coordinate system shown in FIG. 2A), a shape, or an area. This determination may involve a straight-forward triangulation based on the attenuated detection lines, e.g. as disclosed in U.S. Pat. No. 7,432,893 and WO2010/015408, or a more advanced processing to recreate a distribution of attenuation values (for simplicity, referred to as an "attenuation pattern") across the touch surface 1, where each attenuation value represents a local degree of light attenuation. An example of such an attenuation pattern is given in the 3D plot of FIG. 2B, where the peaks of increased attenuation represent touching objects. The attenuation pattern may be further processed by the signal processor 10 or by a separate device (not shown) for determination of a position, shape or area of touching objects. The attenuation pattern may be generated e.g. by any available algorithm for image reconstruction based on projection signal values, including tomographic reconstruction methods such as Filtered Back Projection, FFT-based algorithms, ART (Algebraic Reconstruction Technique), SART (Simultaneous Algebraic Reconstruction Technique), etc. Alternatively, the attenuation pattern may be generated by adapting one or more basis functions and/or by statistical methods such as Bayesian inversion. Examples of such reconstruction functions designed for use in touch determination are found in WO2009/077962, WO2011/049511, WO2011/139213, WO2012/050510, and WO2013/062471, all of which are incorporated herein by reference.

In the illustrated example, the apparatus 100 also includes a controller 12 which is connected to selectively control the activation of the emitters 2 and, possibly, the readout of data from the detectors 3. Depending on implementation, the emitters 2 and/or detectors 3 may be activated in sequence or concurrently, e.g. as disclosed in WO2010/064983. The signal processor 10 and the controller 12 may be configured as separate units, or they may be incorporated in a single unit. One or both of the signal processor 10 and the controller 12 may be at least partially implemented by software executed by a processing unit 14, such as a CPU.

Embodiments of emitters will now be explained in detail with reference to FIG. 3. Generally, these embodiments are presented in the context of the touch-sensitive apparatus shown in FIG. 2A.

One of the main challenges in the art of optical touch sensing is the need to obtain a usable optical signal at the detector side that is sufficiently strong or characteristic so as to be recognizable from background noise. The emitters 2 may generate light in any wavelength range, but FTIR systems preferably operate in the near infrared (NIR), i.e. at wavelengths of about 750 nm-1400 nm, which is also the range in which the following emitter 2 examples generates light. As mentioned, both ambient light and changes to propagating light caused by contamination on the touch surface are factors that must be taken into account. Rather than solely trying to shield the detector side of the touch-sensing system, the Applicant behind the present invention suggests that these problems can be alleviated by means of careful arrangement of the emitters 2. While other types of light sources have been suggested, emitters 2 are generally provided by means of lasers, typically edge-emitting diode lasers, in state of the art FTIR systems. Such diode lasers have several benefits, in particular with regard to cost and availability. However, it has been noted that even with high power laser diodes, there is room for improvement in the signal to noise characteristics.

Figure 3A:
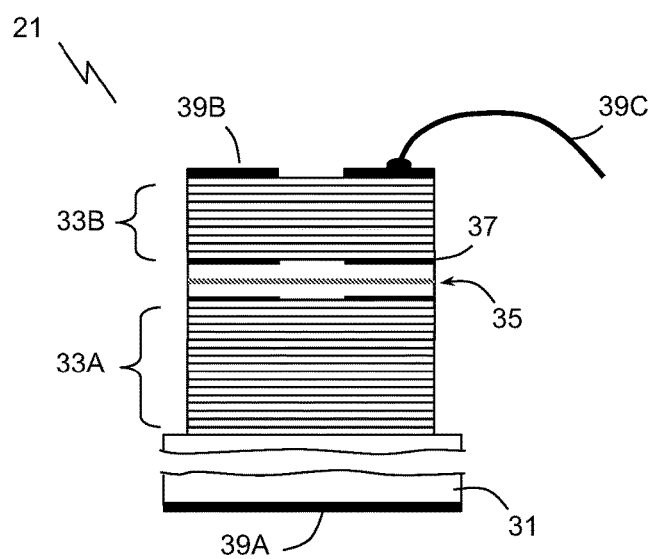
FIG. 3A is section view of a VCSEL, illustrating its internal functional structure.

The present invention suggests providing emitters 2 in the form of VCSEL arrays. A VCSEL, Vertical Cavity Surface-Emitting Laser, is a semiconductor laser which is well known in the art of light sources as such, but which is significantly different from standard edge-emitting diode lasers. FIG. 3A illustrates a typical VCSEL 21, with reference to which the basic structure of this type of laser will be briefly described. It should be noted that VCSELs can be built differently, the design of FIG. 3A being merely one example for the purpose of explaining the general function thereof. The layered structure is built up from a substrate 31, typically a GaAs wafer, and the structure comprises a bottom mirror 33A, a top mirror 33B, with a laser cavity 35 in between. The mirrors 33A and 33B are created as a DBRs, Distributed Bragg Reflectors. The lower mirror 33A is typically an n-type DBR, and has very high reflectivity for the laser wavelength, typically 99.9%, whereas the top mirror 33B typically is a p-type DBR with about 99% reflectivity. This means that the illustrated embodiment is designed to be a top emitting VCSEL 21. Alternatively, it is possible to construct a bottom emitting VCSEL, which provides light out through the substrate 31. The laser cavity 35 comprises at least one quantum well structure, i.e. a single quantum well, or several repeated structures forming a multiple quantum well. A typical example of a single quantum well comprises two AlGaAs layers, with a thin GaAs layer in between in which quantum confinement is achieved. This is indicated in the drawing by a grey central layer of the laser cavity 35. Also, oxide layers 37 are formed between the laser cavity 35 and the respective DBRs 33A and 33B. Each oxide layer 37 is typically shaped with a circular aperture, which provides circular shaping of the laser beam that escapes through the top mirror 33B. The laser is electrically fed by means of cooperating electrodes; e.g. a bottom electrode 39A underneath the substrate 31, and a top electrode 39B for current injection. The top electrode 39B has an aperture for allowing the laser light to escape, and is provided by means for current injection, such as by the illustrated bonding wire 39C.

VCSELs have certain benefits compared to traditional edge-emitting lasers, such as low threshold current, circular beam shape with low divergence, and good temperature stability. Still, these characteristics have hitherto not made VCSELs preferable over edge-emitting laser diodes for FTIR emitter purposes. However, VCSELs have another benefit over edge-emitting lasers that can be utilized, they are possible to build into 2D (two-dimensional) arrays. This is possible since they are grown on the surface of a wafer, whereas a side-emitting laser is cut out from the wafer, making at best a one-dimensional array possible. Also, the Applicant has found that a VCSEL array provides an advantage as an emitter 2 for FTIR purposes, other than simply including several VCSELs in one package.

Figure 3B:
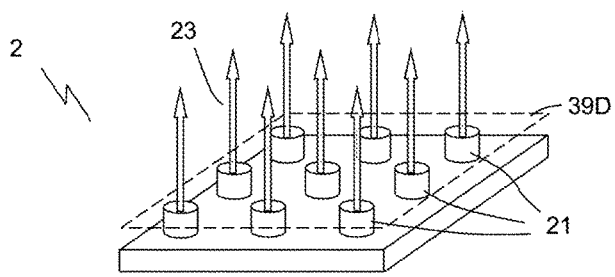
FIG. 3B is an elevated view of an emitter in the form of a VCSEL array.

FIG. 3B schematically shows an emitter 2 comprising a 2D VCSEL array, which in turn includes 9 individual VCSELs 21 in a 3×3 arrangement. Each VCSEL 21 may e.g. be of the type described with reference to FIG. 3A. However, the specific details of the VCSELs 21 are not illustrated in FIG. 3B for the sake of simplicity. All VCSELs 21 in the array are driven in parallel, with the respective top electrodes 39B being interconnected. In one embodiment, indicated by the dashed overhead layer, a common conductive sheet 39D, such as a metal layer, may be provided over the array structure with apertures for each VCSEL 21, either so as to operate as a common top electrode, or connecting to the respective top electrodes 39B of the individual VCSELs 21. The 3×3 array illustrated in FIG. 3B is merely an example to indicate the 2D displacement of the individual VCSELs 21. In other embodiments, the emitter 2 may be formed of a 2D VCSEL array comprising hundreds of individual VCSELs 21. The pitch between two individual VCSELs 21 may be as small as in the order of single μm or larger. It should be noted that the individual VCSELs of the array need not be dispersed in a Cartesian type grid as in FIG. 3B. In other embodiments, the individual VCSELs may be arranged in a hexagonal grid, i.e. in parallel lines, each one offset half a pitch with respect to its neighboring lines. In yet another embodiment the individual VCSELs 21 may be arranged along concentric circles, or in other shapes. Regardless of the specific grid character, it may be realized that in the near field immediately over the emitter 2 the grid-like structure of the individual VCSELs 21 will characterize the irradiance over the field angle of the emitter 2. However, the light beams 23 of the individual VCSELs 21 will blend within a very short distance to form an aggregate light beam of the emitter 2. A benefit of the VCSEL array is a consequence of this aggregation, namely a short coherence length, which means that it has very low speckle. This is believed to be one of the reasons why the Applicant has found that a VCSEL array emitter 2 provides improved signal readout for touch detection in FTIR systems than with a single laser with corresponding power.

Also, a VCSEL array emitter 2 typically provides a light beam with a substantially circular cross-section with a narrow divergence of less than 20° ($1/e^2$), even down to 15°. Preferred embodiments further build on this fact, so as to improve signal detection at the detector 3 side, namely by restricting signal detection to a certain angular range with respect to an outcoupling area of the panel where the detector 3 is connected.

Embodiments of light coupling mechanisms for incoupling of light will now be explained in detail with reference to FIGS. 4-10. Generally, these embodiments are presented in the context of the touch-sensitive apparatus shown in FIG. 2A, in which the light coupling mechanisms are denoted 120.

Figure 4A:
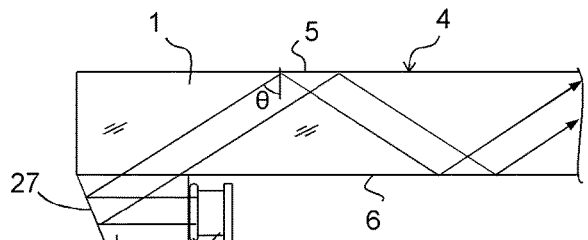
FIG. 4A is a section view of a rear-coupled light coupling mechanism for input of light according to one embodiment.

FIG. 4A illustrates a section that may be taken along any one of the detection lines D of the touch-sensitive apparatus in FIG. 2A. For the sake of simplicity, only a portion of the apparatus at and around the light coupling mechanism is shown. The embodiment of FIG. 4A is a rear side coupled solution, in which the light coupling mechanism comprises a prism 25 configured to direct light from the VCSEL array emitter 2 into the panel 1. More specifically, the prism 25 is preferably configured so as to couple light from the emitter 2 into the panel 1 along a general beam direction having an advantageous angle θ of incidence to the front 5 and rear surfaces 6. Obviously, the angle θ shall be larger than the critical angle $θ_c$. The prism 25 may be made from the same material as the panel 1, or any other material which is transmissive to the wavelength of the emitter 2. Dependent on the specific configuration, the prism 25 may also have a reflective surface 27, rather than having a simply refractive function, provided e.g. by means of a metal coating of the surface 27. For the purpose of optimizing the optical coupling, an index-matching component 29 may further be disposed to link the emitter 2 to the prism 25, such as e.g. a layer of silicone.

Figure 4B:
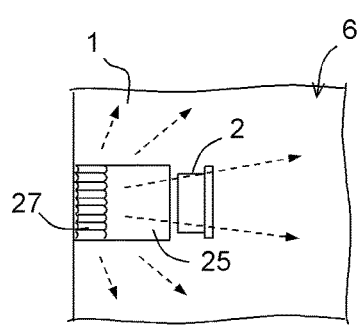
FIG. 4B is a rear side plan view of the embodiment of FIG. 4A.

FIG. 4B illustrates a bottom plan view of an embodiment of the light coupling mechanism of FIG. 4A. While it is beneficial that the emitter 2 has a narrow beam divergence vertically, it is in some embodiments nevertheless preferable that the divergence in the horizontal plane is comparatively wide. The reason is that light from one emitter 2 then can be detected by several detectors 3 dispersed along the periphery of the touch surface 4, as seen in FIG. 2A. One way of obtaining this is to sweep the beam from the emitter 2 over the angular range of interest in the plane of the panel 1. Another way is to optically modify the beam shape from the emitter 2, so as to be more fan-shaped. FIG. 4B schematically illustrates one way of obtaining this effect. In this embodiment, the surface 27 of the prism 25 in which the beam from the VCSEL array emitter 2 is reflected, has a microstructure with repeated curved portions, each portion forming a convex mirror from the inside of the prism 25. This way, light from the emitter 2 may be dispersed in the horizontal plane of the panel, as schematically indicated by the dashed arrows. In the drawing of FIG. 4B there is no index-matching component 29 illustrated, but such a component may of course still be employed. The curved portions of the surface 27 preferably have the same pitch as the pixels of the VCSEL array emitter 2, such that the surface 27 will act as a light coupling mechanism for giving light from a plurality of the VCSELs 21 in the VCSEL array 2 substantially the same spread in the panel 1, preferably all VCSELs 21 of the array 2.

Figure 5A:
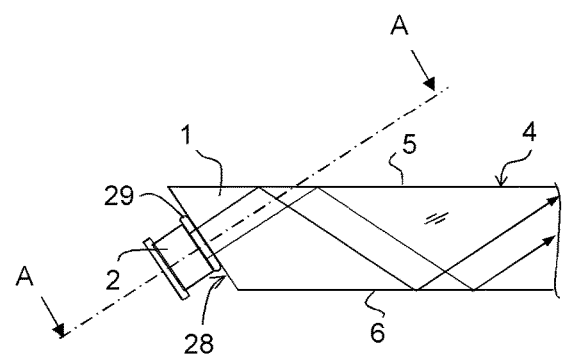
FIG. 5A is a section view of an edge-coupled light coupling mechanism for input of light according to one embodiment.

FIG. 5A illustrates an alternative to the embodiments of FIGS. 4A and 4B. This embodiment makes use of an edge-coupled design, i.e. where light from the emitters 2 is coupled in through a side edge 28 of the panel 1 rather than through the front 5 or rear 6 surface. In the exemplary embodiment of FIG. 5A, a beam direction from the VCSEL array emitter 2 with a suitable angle of incidence to the front 5 and rear 6 surfaces is obtained by means of a wedged shape of the side edge 28, at least at the incoupling site. The VCSEL array emitter 2 may be attached directly to the side edge 28 by means of an index-matching adhesive such as silicone 29. An alternative solution (not shown) may be to couple light from the emitters 2 to the side edge 28 by means of an optical fiber.

Figure 5B:
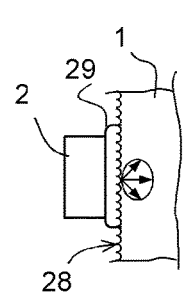
FIGS. 5B and 5C show cross-sectional views of variants of the embodiment of FIG. 5A.

FIG. 5B shows the embodiment of FIG. 5A in a side sectional view, taken along line A-A as indicated in FIG. 5A. In other words, FIG. 5B shows a planar view which is perpendicular to the side edge 28. In this embodiment, the light coupling mechanism comprises a structured side edge 28, configured to provide the desired spread to input light. The structure formed at side edge 28 may be provided only where the emitter 2 is attached. Alternatively, it may be provided consistently at longer portions of the side edge 28, or all the way around the periphery. Preferably, light from the emitter 2 shall be input in a substantially collimated beam in a plane perpendicular to the panel 1 (as indicated by the arrows in FIG. 5A). The structured edge surface 28 may be configured to collimate the light by refraction. However, the light output from the VCSEL array emitter is typically already substantially collimated, and the side edge 28 may therefore alternatively be substantially straight, or flat, in a plane through the panel 1, such as in the view shown in FIG. 5A. Along the side edge, on the other hand, the light coupling mechanism includes a structure which preferably is repeated with the same pitch as that of the VCSELs 21 of the VCSEL array. The structure is designed and aligned to give substantially the same spread to light from a plurality of the VCSEL 21, preferably each, of the array 2, typically in a fan-shape within the panel 1 as indicated by the arrows. The specific shape of the structured edge 28 is dependent on the relative difference in refractive index inside and outside the structured edge 28. If there is an air gap, or an index-matching material 29 with a refractive index lower than that of the panel 1, between the emitter 2 and the panel 1, the structured edge 28 may be configured with a series of concave surface portions aligned to the VCSEL array 2. This is illustrated in the example of FIG. 5B. However, since the VCSEL array is made of a semiconductor structure, it normally has a very high index of refraction. Just as an example, with a VCSEL type as outlined with reference to FIG. 3A, the average index of refraction for the top GaAs/AlGaAs DBR mirror 33B may be in the order of 3.6 for light at 980 nm. This is a lot higher than the index of refraction for the panel 1, regardless of the material chosen from the examples given before, which are all in the range around 1.5. So, if an index matching material 29 is employed which has an index of refraction between that of the VCSEL array 2 and the panel, and preferably closer to that of the VCSEL array 2, the structures on the edge 28 may instead be convex to provide a fan-shaped spread to the input emitter light.

Figure 5C:
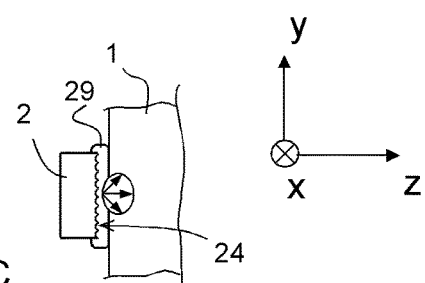

FIG. 5C is provided in the same perspective as FIG. 5B, but shows an alternative variant of the embodiment of FIG. 5A. In this embodiment, the light coupling mechanism is provided by means of a structured surface 24 of the emitter 2, rather than on the edge 28 of the panel. As mentioned, the VCSEL array emitter 2 is typically made from a material which has a higher index of refraction than the panel 1. A spread input is thus obtained by means of a concave structure at the emitter surface 24. An index matching material 29 is employed to optically connect the emitter 2 to the panel 1, preferably with an index of refraction which is closer to that of the panel 1.

Figure 5D:
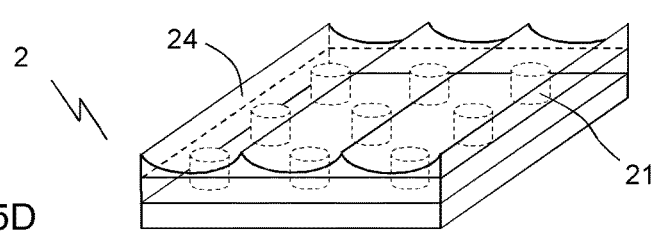
FIG. 5D shows a perspective view of an embodiment applicable e.g. to the embodiment of FIG. 5C.

FIG. 5D shows an example of a VCSEL array emitter 2 as used in the embodiment shown in FIG. 5C, comprising plural individual VCSELs 21. As outlined with respect to FIG. 3B, both the arrangement and the number of VCSELs 21 in the array 2 are exemplary. However, it may be advantageous in some embodiments to arrange the VCSELs 21 in a substantially Cartesian grid, as illustrated. That way a refracting surface 24 pattern which changes in only one dimension, along the y axis in FIGS. 5C and 5D, of the plane of the emitter 2 can be used. If the arrangement of the individual VCSELs 21 in the array 2 is instead such that e.g. every second line of VCSELs 21 along the x axis is offset half a pixel pitch, i.e. in an hexagonal arrangement, a structured surface 24 which also is offset must be used. The repetitive lens pattern 24 on the emitter 2 may e.g. be produced by means of an imprint process. In an alternative embodiment, the lens pattern 24 may be produced in a separate process on an optical wafer, which is later bonded to a wafer on which the VCSEL array 2 is created, and subsequently cut into separate emitter elements.

Figure 6A:
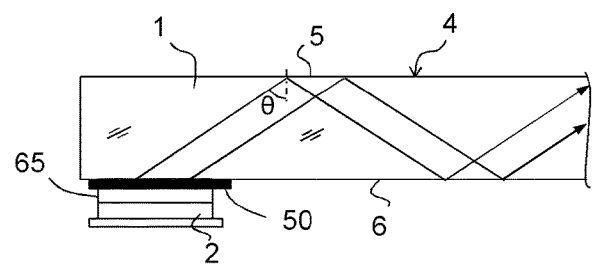
FIG. 6A is a section view of a rear side light coupling mechanism with a visibility filter according to one embodiment.
Figure 6B:
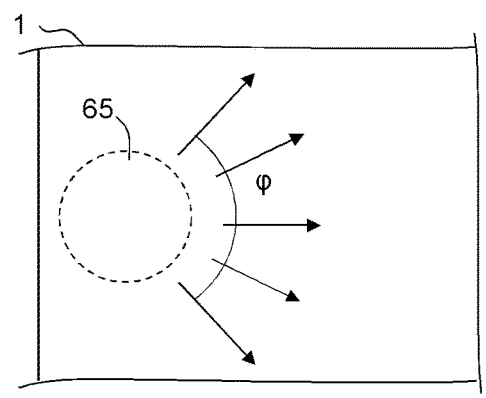
FIG. 6B is a front side plan view of the embodiment of FIG. 6A.

FIGS. 6A and 6B illustrate an alternative to the embodiments of FIGS. 4A and 4B. This embodiment makes use of a rear-side coupled design, i.e. where the emitters 2 are coupled substantially perpendicular to the rear 6 surface. The emitter 2 is coupled to the panel 1 through a light coupling mechanism 65, which is configured to give light from a plurality of the VCSELs 21 in the VCSEL array emitter 2 substantially the same spread in the panel 1, and preferably each VCSEL 21. The drawings of FIGS. 6A and B are quite schematic, and predominantly show the presence of the light coupling mechanism 65, and how light is thereby controlled to propagate in the panel 1. Specific example of how the light coupling mechanism 65 may be configured in a rear-side coupled design will follow below. In preferred embodiments, light is controlled to propagate in a substantially collimated beam vertically at an angle θ to the front surface, as indicated in FIG. 6A. In one embodiment, this angle of incidence is in the range of 50-80°. The lower limit is physically set by Snell's law dependent on the index of refraction for the panel, but care may also be taken to e.g. contamination on the panel surface 5, as will be described below. A very high upper limit will make the pitch between reflections in the front surface 5 higher, which will produce less loss but also limit the resolution of the touch-sensing device. In a preferred embodiment, the angle of incidence may be in the range of 70-80°. Within the plane of the panel 1, on the other hand, light shall preferably be spread in a wide angle φ. The larger the spread the better, and in a preferred embodiment the spread within the panel 1 should be up to 170°

FIG. 6A furthermore illustrates the incorporation of a visibility filter 50, arranged to hide at least the emitter 2, the light-coupling mechanism 65, and the internal structure of the touch-sensitive apparatus 100 from view through the front surface 5. The visibility filter 50 is non-transmissive (opaque) to visible light and transmissive to NIR light, and preferably only transmissive to NIR light in the wavelength region of the propagating light. The visibility filter 50 may be implemented as a coating or film, in one or more layers. In FIG. 6A, the visibility filter 50 is arranged beneath the panel 1, intermediate the rear surface 6 and the light coupling mechanism 65. This enables the front surface 5 to be perfectly flat and free of projecting elements. In a variation, not shown, the visibility filter 50 is applied to the front surface 5. It is to be understood that the visibility filter 50 may be implemented in conjunction with any light coupling mechanism described herein, such as that of FIGS. 4A and 5A, and also in conjunction with any outcoupling structure and related detector, as described below.

Figure 7A:
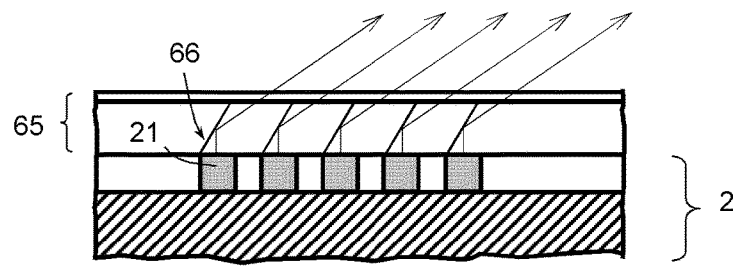
FIG. 7A shows a sectional view of a light coupling mechanism according to one embodiment.

FIG. 7A shows a sectional view of a VCSEL array emitter 2 and a light coupling mechanism 65 in accordance with one embodiment suited for rear-side coupling to a panel 1 as shown in FIG. 6A. In this embodiment, a layer structure is provided over the VCSELs 21, in which beam-deflecting elements 66 are included. These beam-deflecting elements 66 will act as separate mirrors for each one VCSEL 21, in the embodiment shown in FIG. 7A, and thus act as beam-reflecting elements 66. However, it should be noted that other embodiments may employ one beam-deflecting element 66 for two or more VCSELs arranged in a row, such as for the row of VCSELs illustrated in FIG. 7A (cf. FIG. 8C below). A benefit with the configuration shown in FIG. 7A, though, is that it allows for a more compact design. The individual beam-deflecting element 66 are configured to give substantially the same spread to light from each VCSEL 21. In one direction, within the plane through which the cross-sectional view of FIG. 7A is illustrated, that spread is preferably a mere deflection to a certain angle. For this purpose, the respective beam-deflecting elements 66 are preferably flat or straight in a projection to that plane, as shown in the drawing. This angle of the beam-deflecting elements 66 with respect to the light output direction of the VCSELs 21, may be selected with consideration taken to the desired propagation angle θ in a panel 1 to which the emitter 2 and light coupling mechanism 65 is to be connected, and to the respective indices of refraction of such a panel 1 and of the light-coupling mechanism 65. In a variant of this embodiment, not shown, where the light cone angle of the VCSELs 21 of the emitter 2 is larger than desired, each beam-deflecting element 66 may be slightly curved to produce a concave mirror configured to collimate the respective VCSEL beam.

Figure 7B:
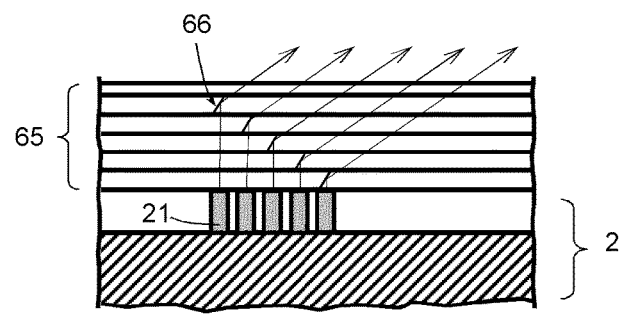
FIG. 7B shows a sectional view of a variant of the light coupling mechanism of FIG. 7A.

FIG. 7B shows a variant of the embodiment of FIG. 7A. When the individual VCSELs 21 of the emitter 2 are tightly packed and/or the desired angle of deflection of the light coupling mechanism 65 is high, a situation may occur where one individual beam-deflecting element 66 at least partly obscures the light path from a VCSEL 21 farther back, i.e. farther to the left in the drawing of FIG. 7A. One solution to this problem is to arrange the individual beam-deflecting elements 66 in a staggered manner, as illustrated in FIG. 7B. This way the total deflected beam is widened, i.e. the aggregate of the individual beams, and VCSEL light deflected from one light-deflecting element 66 will pass safely over the beam-deflecting elements 66 in front. In the example shown in FIG. 7B, each beam-deflecting element 66 is disposed completely over its closest neighboring beam-deflecting elements 66 in the deflection direction, i.e. to the right in the drawing. However, it should be noted that the staggered arrangement may be less pronounced, such that each beam-deflecting element 66 is offset to its neighboring beam-deflecting elements 66 only to a small extent. In such an embodiment (not shown) two adjacent beam-deflecting elements 66 overlap vertically, and are thus partly arranged in the same plane over the VCSEL emitter array 2. There are different conceivable ways of manufacturing structures according to FIG. 7A or 7B, which are all well known in the art, including repeated chemical vapor deposition and etching, or using a micro imprint technique, together with metallization to form the mirrors of the beam-deflecting elements 66. One way of manufacture, as outlined with respect to FIG. 5D, may be to create the light coupling mechanism 65 with its individual beam-deflecting element 66 lens pattern 24 in a separate process on an optical wafer, which is later bonded to a wafer on which the VCSEL array 2 is created, and subsequently cut into separate emitter elements.

Figure 8A:
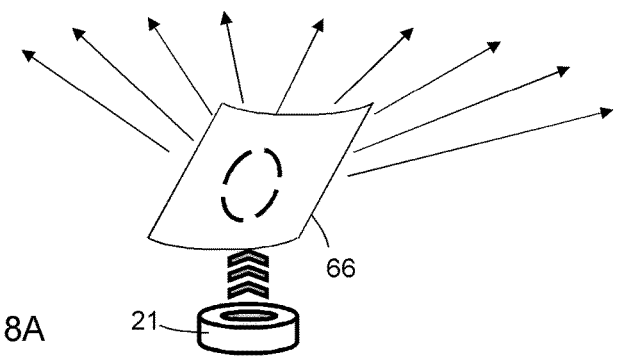
FIG. 8A schematically illustrates a beam-deflecting element of a light coupling mechanism of one embodiment.
Figures 8B, 8C:
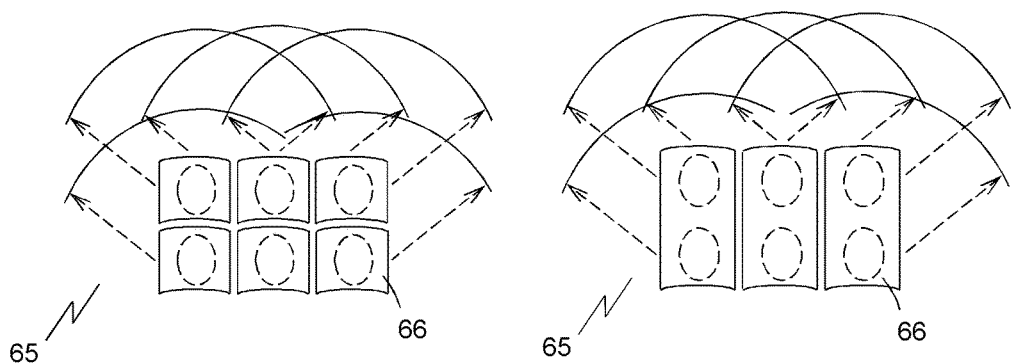
FIG. 8B shows a schematic representation of a two-dimensional array of beam-deflecting elements in accordance with FIG. 8A.
FIG. 8C shows a schematic representation of a one-dimensional array of beam-deflecting elements in accordance with FIG. 8A.

As indicated in FIG. 6B, it may be desirable to obtain a wide spread of light from the emitter 2, such that light may propagate to plural detectors 3 disposed at different positions along the periphery of the panel 1. FIGS. 8A to 8C are included to illustrate how this effect may be achieved in selected embodiments of the light coupling mechanism 65. FIG. 8A schematically illustrates one VCSEL 21 and one associated beam-deflecting element 66, shown in a perspective view, and may represent one beam path of the embodiments of FIG. 7A or 7B. The dashed ring on the beam-deflecting element 66 is meant to indicate where VCSEL light hits. The beam-deflecting element 66 may be configured as a planar mirror, so as to deflect the beam in the plane of a main direction of propagation. However, the mirror 66 is also slightly curved about an axis in the plane of the main direction of propagation of the VCSEL light, as is clearly illustrated in the drawing. This way, a convex mirror effect is obtained, which functions to spread VCSEL light about the main direction of propagation.

FIG. 8B is a top plan view illustrating a subset of the individual beam-deflecting elements 66 of a light coupling mechanism 65. From this drawing it may be gathered that the light from each VCSEL 21 is given substantially the same spread by means of the light coupling mechanism 65, or at least from a plurality of the VCSELs 21. A benefit of this is that light from all VCSELs 21 will combine and propagate to the same detectors 3, as a plurality of aggregate beams. This way, speckle will effectively be minimized at the detector side. The light coupling mechanism 65 of FIG. 8B may e.g. be used in the embodiment of FIG. 7A or 7B.

FIG. 8C is a top plan view of an alternative embodiment of a light coupling mechanism 65, compared to that of FIG. 8B. This drawing is merely included to show what was discussed as an alternative solution to that shown in FIG. 7A, namely with one beam-deflecting element 66 operating to deflect light from two or more VCSELs 21. However, since there is only a plane deflecting effect in the main direction of propagation (upwards in the drawing) also this embodiment will have the effect of steering light from all VCSELs 21 of the array to the same detectors 3.

Figure 9A:
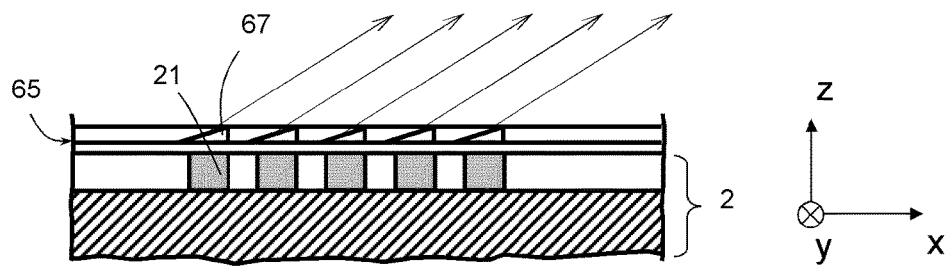
FIG. 9A shows a sectional view of another light coupling mechanism, according to an embodiment based on refraction.
Figure 9B:
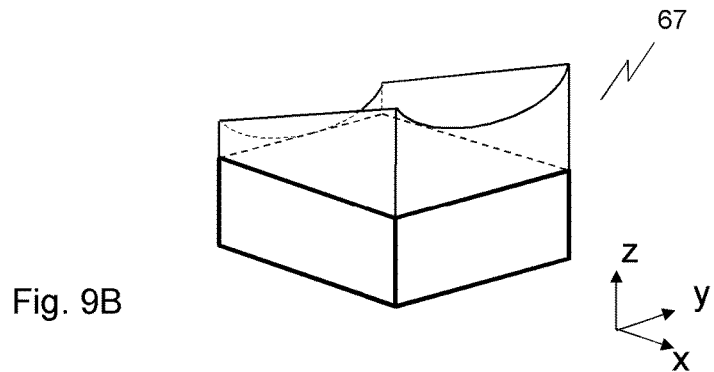
FIG. 9B shows a perspective view of a beam-deflecting element applicable e.g. to the embodiment of FIG. 9A.

While FIGS. 7 and 8 illustrate light coupling mechanisms 65 relying on reflection, FIGS. 9A and 9B show another embodiment relying on refraction. This embodiment may be seen as a variant of the embodiment of FIG. 5C, adapted for rear-side coupling to a panel 1 as indicated in FIG. 6A. In this embodiment, a layer structure is provided over the VCSELs 21, in which beam-deflecting elements 67 are included. These beam-deflecting elements 67 will act to deflect the respective VCSEL beam by refraction, and are thus beam-refracting elements 67. It should thus be understood that the each beam-refracting element 67 is disposed immediately below a layer having an index of refraction which is lower than that of the beam-refracting element 67. Typically, as mentioned before, the light coupling mechanism 65 is connected to a panel 1 by means of an index-matching member, which preferably has an index of refraction between that of the uppermost layer of the light coupling mechanism 65 and that of the panel 1. Also this embodiment may alternatively be devised with beam-refracting elements 67 which are configured to deflect light from two or more VCSELs 21, corresponding to the embodiment of FIG. 8C.

FIG. 9B schematically illustrates one beam-refracting element 67 of the light coupling mechanism 65 of FIG. 9A. To make the drawing more lucid, coordinate axes are inserted in both FIGS. 9A and 9B. From this information it may be gathered that in the xz plane, the beam-refracting element 67 is configured to merely deflect all light a certain angle, as shown in FIG. 9A. However, the curved profile will lead to a spreading in the y direction of light from a VCSEL 21 disposed underneath the beam-refracting element 67, similar to what is indicated in FIG. 6B.

The description of embodiments for spreading of VCSEL light has been given for either reflective beam deflectors or refractive beam deflectors. However, it should be understood that a combination of the two is also possible. As a mere example, the embodiment of FIG. 7B may be configured with flat light-deflecting elements 66, i.e. planar mirrors. This will only result in the deflection shown in FIG. 7B, but no individual spreading of light from the VCSELs in the y direction. However, the uppermost layer of the light coupling mechanism 65 may be configured in accordance with the structured surface 24 of FIG. 5C, which will provide a spread only in the y direction, but not in the x direction. In aggregate, both the deflection to the desired collimated angle θ of propagation within a panel 1 is obtained, and a fan-shaped spread from each individual VCSEL 21 is obtained within an angle φ.

Figure 10:
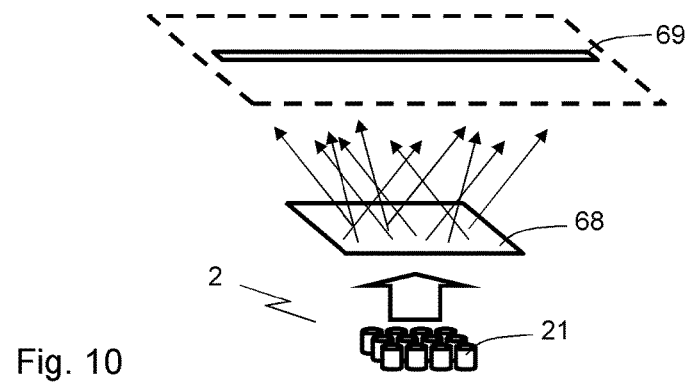
FIG. 10 shows a schematic view of another light coupling mechanism, according to an embodiment based on diffraction.

FIG. 10 illustrates schematically a quite different type of beam deflection, which can be used with the present invention. Rather than reflecting or refracting a VCSEL beam, the light coupling mechanism 65 comprises a layer 68 devised with a diffractive beam-deflecting pattern. The diffractive layer 68 is configured to deflect light from each VCSEL of the array, and any selected beam pattern can be obtained within limits. An example of such a diffractive layer 68 may be a NAFgram sheet as manufactured by the company Nanocomp Oy Ltd. These sheets can be provided in e.g. PET, PMMA or PC in thicknesses of 100-500 μm, and with a spreading angle of up to 90°. The drawing of FIG. 10 intends to show that light from each VCSEL 21 of the array emitter 2 is deflected to all parts of the beam pattern 69, and said beam pattern is indicated to be a substantially one dimensional line. Also the mere deflection may optionally be obtained by means of the diffractive layer 68. Alternatively, the diffractive layer 68 may be combined with e.g. a beam-deflecting light coupling mechanism 65 as that of FIG. 7A, 7B or 9A, with said diffractive layer 68 being configured to provide the fan-shaped spreading in the panel 1. Such a diffractive layer 68 may in such an embodiment e.g. be configured as the uppermost layer in the light-coupling mechanism of the mentioned drawings.

Embodiments of structures for outcoupling and detection of light will now be explained in detail with reference to FIGS. 11-20. Generally, these embodiments are presented in the context of the touch-sensitive apparatus shown in FIG. 2A.

Figure 11:
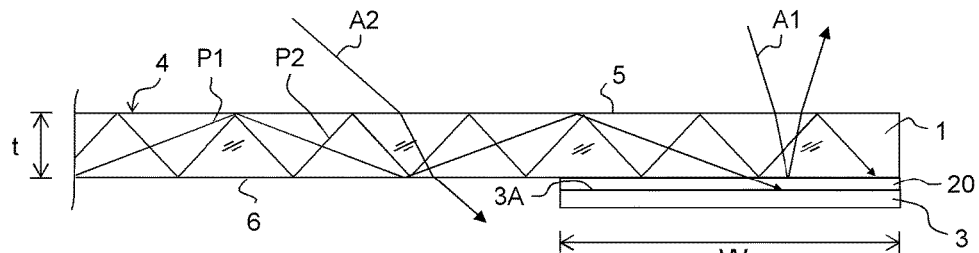
FIG. 11 is a section view of a light outcoupling structure according to a first embodiment.
Figure 12A:
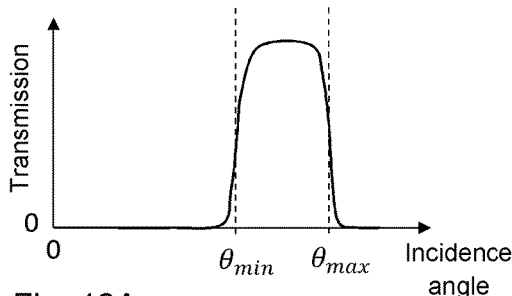
FIG. 12A is a plot of transmission as a function of incidence angle for an angular filter included in the first embodiment.
Figure 12B:
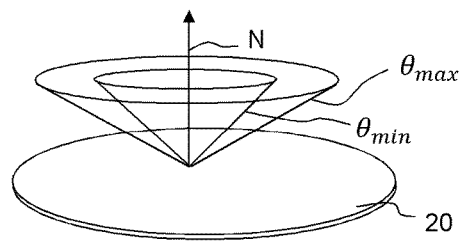
FIG. 12B is a perspective view of the range of angles that are transmitted by the angular filter.

FIG. 11 illustrates a section that may be taken along any one of the detection lines D of the touch-sensitive apparatus in FIG. 2A. For simplicity, only a portion of the apparatus at and around the outcoupling structure is shown. The outcoupling structure is made up of a sheet-like angular filter 20 which is applied with its front face to the panel 1 at the periphery of the touch surface 4 to define an outcoupling port for the light propagating in the panel 1. A detector 3 is applied with its light-sensing surface 3A onto the rear face of the angular filter 20. In an alternative (not shown), a spacer of light transmissive material is disposed between the surface 3A and the filter 20. As used herein, the detector 3 may be any device capable of converting light, at least within a portion of the wavelength range that the emitter operates, into an electrical signal, such as a photo-detector, a CCD device, a CMOS device, etc. The angular filter 20 is designed to only be transmissive to light within a given angular range, i.e. for light that impinges on the filter 20 at certain angles of incidence to the normal N (FIG. 12B) of the filter 20. FIG. 12A is a plot of the transmission of the filter 20 as a function of angle of incidence. As seen, the filter 20 transmits light within a given angular range between a lower limit $\theta_{min}$ and an upper limit $\theta_{max}$, while reflecting light that impinges on the filter at other angles of incidence. Any criterion may be used for defining the limits $\theta_{min}$, $\theta_{max}$, e.g. a percentage (e.g. 25, 50 or 75) of absolute or maximum transmission. FIG. 12B illustrates the angular range in relation to a single position on the front surface of the filter 20. As seen, the angular range is equal in all directions in the plane of the filter 20. Preferably, the angular range is essentially the same at all positions on the filter 20.

The filter 20 may be designed as a dielectric multilayer structure of at least two different materials, similar to an interference filter. It lies within the reach of the person skilled in optical design to select appropriate materials and number of layers to achieve the desired angular range for light at a wavelength generated by the emitters 2.

It should be understood that the filter 20 need not be designed to define the given angular range for all wavelengths, but only for a limited wavelength range that includes the wavelength(s) of the propagating light. In a preferred embodiment, the angular filter 20 is reflective to all angles outside the limited wavelength range. In this aspect, the use of a VCSEL array as emitter 2 provides an additional benefit, since it is very narrow light source. Typically, a VCSEL is a single mode laser, and a VCSEL array emitter 2 may have a spectral width of <1 nm FWHM (Full Width at Half Maximum). In addition, a VCSEL exhibits high temperature stability, with very little drift of less than 0.1 nm/deg. It is thereby possible to have a very narrow band pass filter of less than 5 nm. This way it is possible to block out virtually all ambient light outside the spectral range of the emitter, by means of an appropriate band pass filter, which may significantly increase the signal to noise ratio at the detector side. Such a band pass filter function may be arranged in the angular filter 20 by means of the structure and material choice of said dielectric layers in the filter 20. Alternatively, the band pass filter function may be provided as a separate element in addition to the angular filter 20, e.g. if the angular filter is of a more mechanically shielding nature as described below with reference to FIGS. 18A and 18B.

It should also be understood that the filter 20 is designed to provide the angular range [$\theta_{min}$-$\theta_{max}$] for a specific installation, i.e. when mounted with its front face to the panel 1 and with its rear side to the surface 3A (or a spacer). For example, the design may be adapted to the refractive index of the panel 1 and the refractive index of the light-sensing surface 3A (or the spacer).

In embodiments of the invention, the filter 20 is tailored to suppress the amount of ambient light received at the light-sensing surface 3A in relation to the amount of useful light, i.e. light that has propagated on one or more detection lines from a respective incoupling structure. This effect may be achieved by adapting the angular range of the filter 20 to the angles of incidence (AOI) of the propagating light on the filter 20. Ambient light typically contains daylight and/or light from artificial light sources. Such ambient light includes NIR light which, if it falls on the surface 3A, will interfere with the detection of the propagating NIR light inside the panel 1. As exemplified by ray A1 shown in FIG. 11, ambient light that falls on the front surface 5 is refracted into the panel 1 and would have impinged on the surface 3A were it not for the angular filter 20. The angular filter 20 is designed to reflect the ambient light A1 back towards the front surface 5. Ambient light that falls onto the touch surface 4 at other areas than over the detector 3 will, irrespective of its angle to the touch surface 4, be transmitted through the panel 1, as exemplified by ray A2. The ambient light will not be captured by TIR in the panel 1 since it cannot be refracted into the panel 1 at an angle larger than the critical angle (see below). As exemplified by ray P1, light that propagates in the panel 1 by TIR and strikes the filter at an AOI within the angular range of the filter 20, is transmitted to the light-sensing surface 3A. FIG. 11 also indicates a ray P2 that propagates in the panel 1 by TIR and strikes the filter 20 at a smaller AOI, which is outside the angular range of the filter 20. This ray P2 is reflected by the filter 20. However, with an emitter 2 in the form of a narrow beam VCSEL array, and careful design of the filter 20, a substantial amount of light injected from the emitter 2 may be used for detection by the detector 3. In other words, very few, if any, rays of light emanating from the emitter 2 will propagate like ray P2 of FIG. 11. Preferably, the filter 20 is configured to let through light to the detector 3 within an angular range which is tailored to the beam divergence of the VCSEL array emitter 2. It should be noted that a beam divergence of e.g. 19° (1/e$^2$), such as offered in VCSEL arrays provided by Princeton Optronics Inc., translates to about 12.5° (1/e$^2$) in a panel with a refractive index of 1.5. It can thereby be understood that it is possible to make use of a very narrow angular filter, virtually without sacrificing or losing any emitter light. The use of an angular filter 20 in combination with a VCSEL array emitter 2 thus provides a simple technique for selecting the light that is passed to the detector 3 to be represented in the projection signals.

Figure 13:
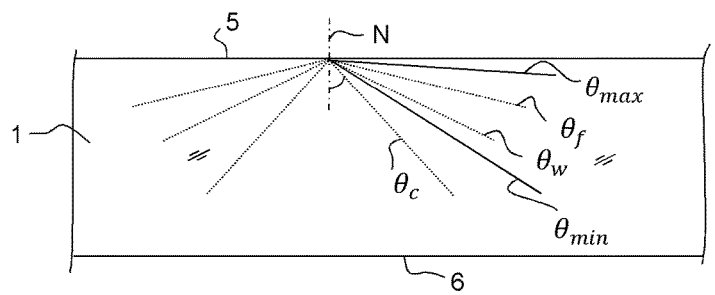
FIG. 13 is a section view to illustrate characteristic angles of the angular filter and characteristic angles of the panel.

The present Applicant has realized that advantageous technical effects may be achieved by careful selection of the lower limit $\theta_{min}$ of the filter 20. FIG. 13 illustrates, in section view, a portion of the panel 1, where different characteristic angles of the panel 1, as well as the limits $\theta_{min}$, $\theta_{max}$ of the filter 20, are mapped to a position on the front surface 5. In this example, it is assumed that the panel 1 is made of a single material and has the same refractive index $n_{panel}$ at the front and rear surfaces 5, 6. All angles are defined with respect to the normal N of the front surface 5.

FIG. 13 indicates the critical angle $\theta_c$, which is given by $\theta_c = \arcsin(1/n_{panel})$ and is the minimum AOI of the light that propagates by TIR between the surfaces 5, 6. FIG. 13 also indicates a cut-off angle $\theta_w$ for interaction between the propagating light and water deposited on the front surface 5.

Propagating light that strikes the surface 5 at AOIs below $\theta_w$ will be partly coupled out of the panel 1 and into water on the surface 5, whereas propagating light at AOIs above $\theta_w$ will be totally reflected at the interface between the surface 5 and water. According to Snell's law: $n_{panel} \cdot \sin(\theta_w) = n_w \cdot \sin(90°)$, which yields $\theta_w = \arcsin(n_w/n_{panel})$, where the refractive index of water, $n_w$, is in the range 1.31-1.34, depending on temperature, wavelength, salt content, etc. In the following examples, it is assumed that $n_w = 1.33$. FIG. 13 also indicates a cut-off angle $\theta_f$ for interaction between the propagating light and finger fat deposited on the front surface 5. Propagating light that strikes the surface 5 at AOIs below $\theta_f$ will be partly coupled out of the panel 1 and into finger fat on the surface 5, whereas propagating light at AOIs above $\theta_f$ will be totally reflected at the interface between the surface 5 and finger fat. According to Snell's law: $n_{panel} \cdot \sin(\theta_f) = n_f \cdot \sin(90°)$, which yields $\theta_f = \arcsin(n_f/n_{panel})$, where the refractive index of finger fat, $n_f$, is in the range of 1.36-1.48, depending on temperature, wavelength, composition, etc. In the following examples, it is assumed that $\theta_f = 1.45$. In the example of a panel made of PMMA with $n_{panel} = 1.49$, this approximately yields $\theta_c = 42°$, $\theta_w = 63°$, and $\theta_f = 77°$.

In one embodiment, the angular range is set to $\theta_{min} \approx \theta_c < \theta_{max} < 90°$. This will ensure that all propagating light reaches the light-sensing surface 3A while preventing a major part of the ambient light from striking the light-sensing surface 3A.

Further suppression of interferences, i.e. unwanted signal components at the light-sensing surface 3A, may be achieved by setting $\theta_{min}$ to exceed $\theta_c$.

Figure 14:
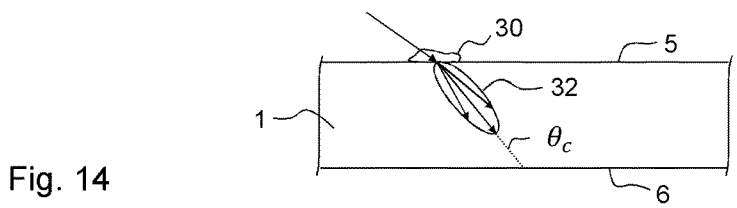
FIG. 14 is a section view to illustrate incoupling of ambient light via contamination on the touch surface.

In one such embodiment, the angular range is set to $\theta_{min} = \theta_c + \Delta\theta < \theta_{max} < 90°$, with $\Delta\theta$ equal to, or larger than, e.g. 5°, 10° or 15°. This embodiment has been found to significantly reduce the influence of ambient light that is coupled into the panel 1 through deposits on the touch surface 4, such as water, saliva, fingerprints, smear, etc (collectively denoted "contamination" herein). With reference to ray A2 in FIG. 11, it was mentioned that all ambient light that falls onto the touch surface 4 will pass through the panel 1. However, the present Applicant has found that this is only true for a perfectly clean touch surface 4. As indicated in FIG. 14, contamination 30 on the touch surface 4 may allow ambient light at an angle of incidence near or larger than $\theta_c$ to leak into the panel 1 and be trapped by TIR therein. The present Applicant has realized that this ambient light may have a sizeable influence on the measured signal levels at the detector 3. The Applicant has also found, surprisingly, that the trapped ambient light is largely concentrated to a limited range of AOIs at the filter 20, close to and above the critical angle $\theta_c$. Thus, the trapped ambient light can be prevented from reaching the detector 3 by choosing $\theta_{min} = \theta_c + \Delta\theta$ with an angular span $\Delta\theta$ equal to or larger than the limited range of AOIs. It is currently believed that the concentration of the ambient light to the limited range of AOIs is caused by Mie scattering in the contamination 30, as well as refraction by contamination droplets, causing the ambient light to enter the panel with a slightly widened distribution, as indicated by 32 in FIG. 14. The widening due to Mie scattering and refraction in contamination droplets may be in the range of ±5° to ±10°. The ambient light typically falls onto the contamination 30 at many different angles. Since all ambient light that enters the panel 1 at an angle below $\theta_c$ will pass through the panel 1 and since the intensity of the ambient light typically decreases with increasing angle to the normal N of the panel, the trapped ambient light will be concentrated at and slightly above $\theta_c$. It should also be noted that if the refractive index of the panel 1 is larger than the refractive index of the contamination 30: $n_{panel} > n_{cont}$, the AOIs for the ambient light refracted into the panel 1 via the contamination 30 cannot exceed $\arcsin(n_{cont}/n_{panel})$.

The present Applicant has found that further advantageous and unexpected effects are achieved by designing the filter 20 with a given relation between the lower limit $\theta_{min}$ and the cut-off angle $\theta_w$ or $\theta_f$.

In one such embodiment, the angular range is set to $\theta_{min} \leq \theta \leq \theta_{max}$, where $\theta_{min} \geq \theta_w$ and $\theta_{max} < 90°$. Thus, the filter 20 is designed to only transmit light with AOIs that are equal to or larger than the cut-off angle $\theta_w$ for water. This embodiment has the ability of significantly reducing the influence on the resulting projection signals from water-containing deposits on the touch surface 4. As noted above, the portion of the propagating light that strikes water at AOIs below $\theta_w$ will be at least partially coupled out of the panel 1 and interact with the water. Thus, the portion of the propagating light that reaches the filter 20 at AOIs below $\theta_w$ has been significantly more attenuated by water than the remainder of the propagating light. This embodiment also has the ability of reducing the impact of differences in finger interaction between users and even between fingers of a single user. These differences may make it difficult to properly detect all touching objects on the touch surface, and it may require the signal processor 10 to be configured with a large dynamic range for retrieving and processing the projection signals. A significant part of the differences in finger interaction has been found to emanate from different moisture levels on the fingers. The filter design of this embodiment will suppress the influence of moisture in the projection signals and thus reduce the impact of differences in finger interaction.

In this embodiment, the propagating light that is transmitted by the filter 20 has impinged on the touch surface 4 with AOIs at or above $\theta_w$. At these AOIs, the propagating light will still be coupled into the outermost layer of the finger that form part of the epidermis, since this layer (stratum corneum) is known to have a refractive index of about 1.55 in the infrared, e.g. according to measurement results presented in "*A survey of some fundamental aspects of the absorption and reflection of light by tissue*", by R. J. Scheuplein, published in J. soc. cos. CHEM. 15, 111-122 (1964), and "*The optics of human skin*", by Anderson and Parrish, published in Journal of Investigative Dermatology 77, 1, 13-19 (1981). This means that propagating light is coupled into the finger for AOIs at least up to a cutoff angle $\theta_{cs} = \arcsin(1.55/n_{panel})$. If $n_{panel} \leq 1.55$, the cutoff angle $\theta_{cs}$ is not relevant, and all AOIs below 90° will interact with the stratum corneum (and other outer layers of the finger). If $n_{panel} > 1.55$, it is conceivable to set $\theta_{max} \leq \theta_{cs}$ for the filter 20, should there be a need to suppress propagating light at AOIs above $\theta_{cs}$.

It should also be noted that this embodiment fully eliminates ambient light that has been coupled into the panel via water on the touch surface 4 and has propagated by TIR to the filter 20. As explained above, this ambient light has a maximum AOI of $\arcsin(n_{cont}/n_{panel})$, which is equal to $\theta_w$ with $n_{cont} = n_w$.

In another embodiment, the angular range is set to $\theta_{min} \leq \theta \leq \theta_{max}$, where $\theta_{min} \geq \theta_f$ and $\theta_{max} < 90°$. This embodiment has the ability of significantly reducing the influence on the resulting projection signals from deposits containing finger fat, e.g. fingerprints, on the touch surface 4. Fingerprints is typically a substantial part of the contamination on the touch surface, and is a major concern when processing the projection signals for detecting the touching objects. It is thus a significant technical achievement to be able to suppress the influence of fingerprints, and it will reduce the requirements on the signal processor 10 to track and compensate for contaminations. This embodiment also has the ability of further reducing the impact of differences in finger interaction, since it suppresses the interaction caused by fat on the fingers. Furthermore, this embodiment fully eliminates ambient light that has been coupled into the panel via finger fat on the touch surface 4 and has propagated by TIR to the filter 20. This ambient light has a maximum AOI of arc $\sin(n_{cont}/n_{panel})$, which is equal to $\theta_f$ with $n_{cont}=n_f$.

Reverting to FIG. 11, the width W of the filter 20 (in the direction of the respective detection line) may be optimized with respect to the range of AOIs of the propagating light that should be transmitted onto the light-sensing surface 3A. To ensure that all of this propagating light (i.e. the light with appropriate AOIs) strikes the filter at least once, the width W may be set to exceed the relevant minimum distance between bounces in the rear surface ("minimum bounce distance"). If the panel is made of a single material, the minimum bounce distance is given by $2 \cdot t \cdot \tan(\theta_{min})$, where t is the thickness of the panel 1. To achieve a consistent detection of the propagating light within the limits $\theta_{min}$, $\theta_{max}$, it may be desirable to set the width to exceed the relevant maximum distance between bounces in the rear surface ("maximum bounce distance"). If the panel is made of a single material, the maximum bounce distance is given by $2 \cdot t \cdot \tan(\theta_{max})$. In practice, the width W may be given by other design considerations, which may (but need not) set the limit $\theta_{max}$ of the filter 20. Further, the skilled person is able to calculate the minimum bounce distance and the maximum bounce distance for a panel consisting of more than one layer.

Figure 15:
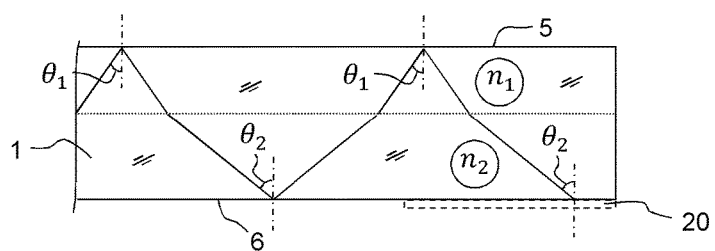
FIG. 15 is a section view to illustrate a relation between bounce angles in a two-layer panel.

The foregoing design rules for the angular filter were given for a panel 1 with a single index of refraction. However, corresponding design rules are applicable for the angular filter 20 when applied to a panel 1 made up of two or more layers with different index of refraction. FIG. 15 illustrates a panel 1 formed by a top layer with index of refraction $n_1$ and a bottom layer with index of refraction $n_2$. Light having an angle of incidence $\theta_1$ at the front surface 5 will impinge on the rear surface 6 with an angle of incidence $\theta_2 = \arcsin(n_1/n_2 \cdot \sin(\theta_1))$. This means that the limits $\theta_{min}$, $\theta_{max}$ of the filter 20, if mounted on the rear surface 6, should be set with respect to the critical angle $\theta_c$ at the front surface 5 as represented at the rear surface 6, or with respect to the cut-off angles $\theta_w$, $\theta_f$ at the front surface 5 as represented at the rear surface 6. The skilled person realizes that $n_{panel}$ in the above expressions for $\theta_c$, $\theta_w$ and $\theta_f$ is the refractive index of the panel 1 at the outcoupling region where the filter is mounted. In the example of FIG. 15, $n_{panel}=n_2$.

Figure 16:
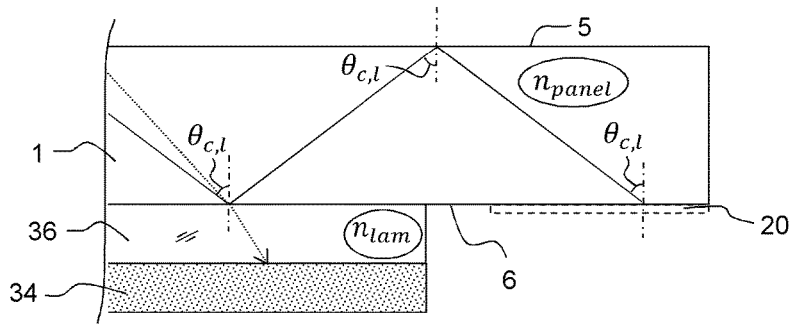
FIG. 16 is a section view to illustrate bounce angles in a panel which is laminated to a display device.

A different situation may arise if the panel 1 is laminated to a display 34 by means of a lamination layer 36, as shown in FIG. 16. If the display 34 does not reflect light back to the panel 1, the lamination layer 36 may be designed with a smaller refractive index $n_{lam}$ than the panel. This will cause light that impinges on the interface between the panel and the lamination layer 36 at angles equal to $\theta_{c,l}=\arcsin(n_{lam}/n_{panel})$, or larger, to be totally reflected at this interface. Light that impinges on the interface at smaller angles, e.g. as indicated by a dotted arrow in FIG. 16, will be transmitted via the lamination layer 36 to the display 34. This means that the minimum AOI of the light that propagates by TIR between the surfaces 5, 6 and strikes the filter 20, is $\theta_{c,l}$ rather than $\theta_c$. In such an embodiment the angular range of the filter 20 may be set according to $\theta_{min} \leq \theta \leq \theta_{max}$, where $\theta_{min} \geq \theta_{c,l}$ and $\theta_{max} < 90°$. Of course, the angular range may instead be designed with respect to $\theta_w$ or $\theta_f$ according to the embodiments described above.

It should be noted that a lamination layer 36 may generally be introduced between the rear surface 6 of the panel 1 and any external device when it is desirable to "optically isolate" the propagating light in panel from the external device, whereby the propagating light is shifted to larger angles of incidence by virtue of $\theta_{c,l} > \theta_c$. Based on the foregoing discussion, it is understood that it may be desirable to select the material of the lamination layer 36 such that $\theta_{c,l} \geq \theta_w$ or $\theta_{c,l} \geq \theta_f$, so as to reduce the attenuation caused by contamination on the touch surface 4. In another variant, it may be desirable to select the material of the lamination layer 36 such that $\theta_{c,l} \geq \theta_c + \Delta\theta$, where $\Delta\theta$ is selected to reduce the influence of ambient light that enters the panel via contamination on the touch surface 4, as discussed above with reference to FIG. 14. For efficient utilization of light, the light emitters 2 may be coupled to the panel 1 such that the injected light impinges on the lamination layer 36 at an AOI that exceeds $\theta_{c,l}$, to avoid that useful light is leaked into the lamination layer 36. The concept of using a lamination layer 36 for reducing the impact of ambient light or contamination may, but need not, be used in combination with an angular filter in the outcoupling structure and/or an angular filter in the incoupling structure (see below).

Figure 20:
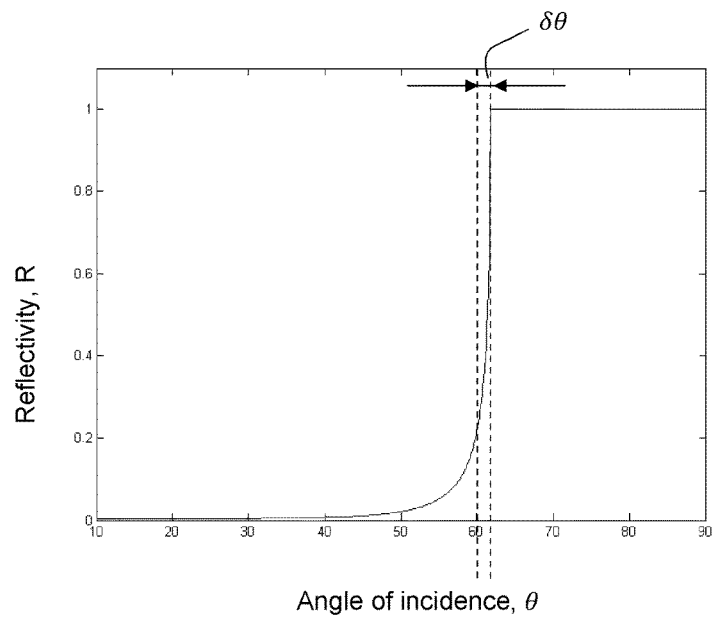
FIG. 20 is a graph of light reflectivity at a panel-water interface as a function of angle of incidence inside the panel.

In the foregoing, it has been assumed that the cutoff angles $\theta_w$ and $\theta_f$ are given by the TIR angle at the interface between the panel and water and finger fat, respectively. However, it shall be appreciated that the TIR angles correspond to 100% reflection at the interface, and that the reflectivity at the interface does not exhibit a step change at the TIR angle but is a continuous, but steep, function within increasing AOI until the TIR angle. This is illustrated in FIG. 20, which is a graph of the reflectivity R at a panel-to-water interface as a function of AOI, $\theta$, given by the equations:

$$R_p = \left| \frac{n_{panel} * \cos\theta - n_w * \sqrt{1 - \left(\frac{n_{panel}}{n_w}\sin\theta\right)^2}}{n_{panel} * \cos\theta + n_w * \sqrt{1 - \left(\frac{n_{panel}}{n_w}\sin\theta\right)^2}} \right|^2$$

$$R_s = \left| \frac{n_{panel} * \sqrt{1 - \left(\frac{n_{panel}}{n_w}\sin\theta\right)^2} - n_w * \cos\theta}{n_{panel} * \sqrt{1 - \left(\frac{n_{panel}}{n_w}\sin\theta\right)^2} + n_w * \cos\theta} \right|^2$$

$$R = \frac{R_s + R_p}{2}$$

with $n_{panel}=1.51$ and $n_w=1.33$.

As understood from FIG. 20, it is possible to define the cutoff angles $\theta_w$ and $\theta_f$ at a given fraction of 100% reflection, e.g. 0.25 or 0.50, while still achieving an essentially complete suppression of the influence of water and finger fat, respectively. In practice, this means that it is possible to adjust the cutoff angles slightly from the TIR angles towards smaller AOIs: $\theta_w = \arcsin(n_w/n_{panel}) - \delta\theta$ and $\theta_f = \arcsin(n_f/n_{panel}) - \delta\theta$, where $\delta\theta$ is typically less than 2°. As used herein, any reference to $\theta_w$ and $\theta_f$ is intended to inherently include this minor shift $\delta\theta$.

Generally, it may be desirable to limit the size of the individual detectors 3, and specifically the extent of the light-sensing surface 3A. For example, the cost of light detectors may increase with size. Also, a larger detector typically has a larger capacitance, which may lead to slower response (longer rise and fall times) of the detector. It is realized that it may be difficult to reduce the extent W of the detector 3 in the embodiment of FIG. 11, without sacrificing the ability to consistently detect the propagating light.

Figure 17A:
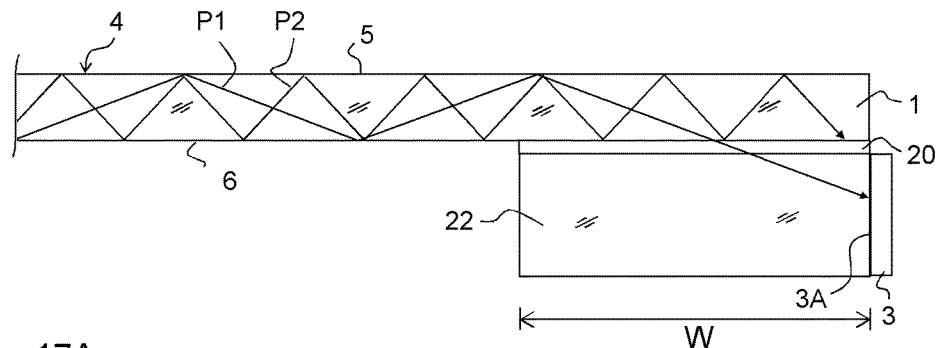
FIG. 17A is a section view of a light outcoupling structure according to a second embodiment.

FIG. 17A illustrates an alternative embodiment that at least partly overcomes this problem. Like in FIG. 11, the angular filter 20 is applied to the rear surface 6, but the detector 3 is arranged with its light-sensing surface 3A essentially perpendicular to the main extent of the panel 1. As used herein, "essentially perpendicular" is intended to include deviations of about ±20° or less from perpendicular. A spacer 22 is disposed between the angular filter 20 and the light-sensing surface 3A. The spacer 22 may be made of any suitable light transmissive material, such a plastic material or glass, or a silicone compound, a glue, a gel, etc. In the example of FIG. 17A, the spacer 22 is made of the same material as the panel 1, i.e. $n_{spacer}=n_{panel}$. By arranging the surface 3A vertically, the extent of the surface 3A may be reduced significantly compared to the embodiment in FIG. 11. When the extent of the angular filter is W, the minimum vertical extent of the surface 3A may be given by W/tan ($\theta_{min}$) to ensure that all of the transmitted light from the filter 20 is received at the surface 3A. The extent of the surface 3A may be reduced further by selecting the material of the spacer 22 such that $n_{spacer}<n_{panel}$, causing the transmitted light to be refracted away from the normal and resulting in a smaller projected height at the location of the surface 3A.

Even if the outcoupling structure in FIG. 17A allows for a smaller light-sensing surface 3A, the extent of the surface 3A is still dependent on the angular range of the filter 20. Further, the vertical extent of the surface 3A has a direct impact on the thickness of the apparatus 100. At present, the embodiment in FIG. 17A is believed to be useful only when $\theta_{min}$ is larger than about 45°, to avoid that the height of the outcoupling structure becomes excessive.

Figure 17B:
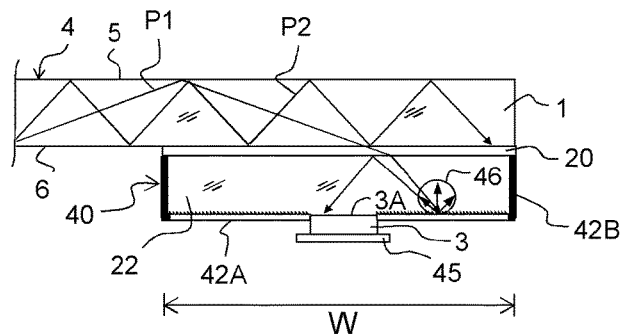
FIGS. 17B-17C are section and plan views of a light outcoupling structure according to a third embodiment.
Figure 17C:
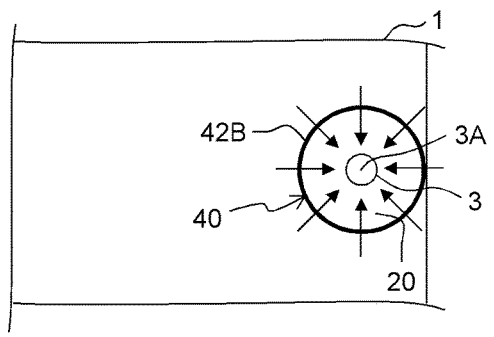

This problem is at least partly overcome by the embodiment illustrated in FIGS. 17B-17C. As shown in section in FIG. 17B, the angular filter 20 is applied to the rear surface 6, and a light recycler 40 is arranged beneath the filter 20 in surrounding relationship to the light-sensing surface 3A. The recycler 40 is designed to internally reflect the light that is transmitted by the filter 20 and to modify the angular distribution of the transmitted light. The recycler 40 defines a reflective enclosure around the light-sensing surface 3A. The enclosure is filled by a spacer material 22, e.g. any of the spacer materials discussed in relation to FIG. 17A. The recycler 40 comprises a reflective bottom surface 42A with an opening for the detector 3 (illustrated as mounted on a PCB 45) and reflective sidewalls 42B that extend from the bottom surface 42A to the filter 20. In the illustrated embodiment, the bottom surface 42A is diffusively reflective to impinging light, whereas the sidewalls 42B are specularly reflective to impinging light. As used herein, "specular reflection" is given its ordinary meaning, which refers to the mirror-like reflection of light from a surface, in which light from a single incoming direction (a ray) is reflected into a single outgoing direction. Specular reflection is described by the law of reflection, which states that the direction of incoming light (the incident ray), and the direction of outgoing light reflected (the reflected ray) make the same angle with respect to the surface normal, and that the incident, normal, and reflected directions are coplanar. As used herein, "diffuse reflection" is given its ordinary meaning, which refers to reflection of light from a surface such that an incident ray is reflected at many angles rather than at just one angle as in specular reflection. The diffuse reflection is also known as "scattering". The skilled person appreciates that many surfaces/elements/materials exhibit a combination of specular and diffuse reflection. As used herein, a surface is considered "diffusively reflective" when at least 20% of the reflected light is diffuse. The relation between diffuse and specular reflection is a measurable property of all surfaces/elements/materials.

To exemplify the function of the outcoupling structure, FIG. 17B illustrates a single ray P1 that is transmitted and refracted into the recycler 40 by the filter 20. The ray strikes the bottom wall 42A and is diffusively reflected, as indicated by the encircled rays 46. The diffusively reflected light spreads over a large solid angle in the recycler 40, and some of this light is specularly reflected by the filter 20 onto the light-sensing surface 3A. Although not shown, other parts of the diffusively reflected light is likely to undergo further reflections in the recycler 40, against the sidewalls 42B, the angular filter 20 and the bottom wall 42A, and eventually impinge on the surface 3A. It should be noted that the angular filter 20 will also transmit light from the recycler 40 back into the panel 1, specifically light that has an angle of incidence within a given angular range which may, but need not, be identical to the angular range [$\theta_{min}$-$\theta_{max}$]. If these angular ranges are identical, or at least substantially overlapping, it is necessary to redistribute the light by diffuse reflection inside the recycler 40 to prevent that the light that enters the recycler 40 from the panel 1 escapes back into the panel 1 via the filter 20. If the filter 20 is designed such that the angular ranges are sufficiently different, the recycler 40 may be configured with only specularly reflective walls 42A, 42B.

In the embodiment of FIG. 17B, the use of specular side walls 42B ensures that all of the light that enters the recycler 40 via the filter 20 is re-directed by specular reflection(s) towards the bottom of the recycler 40, where it is either redistributed by diffuse reflection in the bottom wall 42A or directly received by the light-sensing surface 3A. The diffusively reflected light is typically, but not necessarily, emitted with a main direction that is perpendicular to the bottom wall 42A, as shown in FIG. 17B. The bottom wall 42A may e.g. be a near-Lambertian diffuser. The use of a planar bottom wall 42A, as in FIG. 17B, ensures that most of the diffusively reflected light hits the filter 20 at AOIs outside the angular range, such that main portion of the diffusively reflected light is reflected by the filter 20 back into the recycler 40.

In an alternative, both the bottom wall 42A and the side walls 42B are diffusively reflective. In another alternative, the side walls 42B are diffusively reflective, while the bottom surface 42A is specularly reflective. In all embodiments, it is possible that only a part of the bottom wall 42A and/or the side walls 42B is diffusively reflective. Generally, it may be advantageous to provide diffusive scattering on surfaces that are arranged such that a significant portion of the light impinging on these surfaces would otherwise be specularly reflected onto the filter 20 within the angular range.

In yet another alternative, the bottom wall 42A is not specularly or diffusively reflective, but provided with a micro-structure, which is configured to reflect and re-direct impinging light onto the light sensing-surface 3A, by specular reflection against the filter 20 and possibly by reflection against the specular side walls 42B. The micro-structure thus forms a mirror with an optical power that is tailored to the incoming light, i.e. the light that is transmitted by the filter 20 and hits the micro-structure on the bottom wall 42A, either directly or by reflection(s) in the side walls 42B. The use of specularly reflective side walls 42B may facilitate the design of the micro-structure, but it is possible to use diffusively reflective side walls 42B, or a combination thereof. The micro-structure may be implemented as a sheet-like Fresnel mirror.

Compared to the embodiments in FIG. 11 and FIG. 17A, there is no direct relation between the extent of the angular filter 20 and the required size of the light-sensing surface 3A, since the recycler 40 is designed to retain a portion of the transmitted light by internal reflections until it impinges on the surface 3A. Furthermore, there is large freedom of placing the detector 3 in relation to the recycler 40, and it can even be accommodated in a side wall 42B instead of the bottom wall 42A. It is realized that the outcoupling structure may be optimized with respect to manufacturing requirements, without any major loss in outcoupling efficiency. Also, assembly tolerances may be relaxed.

As shown in the plan view of FIG. 17C, the combination of angular filter 20 and recycler 40 will collect light from all directions in the plane of the panel 1, provided that the incoming light impinges on the angular filter 20 with AOIs within the angular range [$\theta_{min}$-$\theta_{max}$]. Thus, the outcoupling structure in FIG. 17C can accept light from many different directions in the plane of the panel 1 and define the end point of detection lines from different emitters (cf. FIG. 2A). In the example of FIG. 17C, the recycler 40 is circular in plan view, but other shapes are possible, e.g. elliptical or polygonal. As described in relation to FIG. 11, it may be desirable that the extent W of the recycler along each of the detection lines is equal to at least the minimum bounce distance or at least the maximum bounce distance.

In all embodiments, the specularly reflective wall(s) of the recycler 40, if present, may be implemented by an external coating, layer or film which is applied to the spacer material 22, e.g. a metal such as aluminum, copper or silver, or a multilayer structure, as is well-known to the skilled person.

In all embodiments, the diffusively reflective wall(s) of the recycler 40, if present, may be implemented by an external coating, layer or film of diffusively reflective material which is applied to the spacer material 22. In one implementation, the diffusively reflective material is a matte white paint or ink. In order to achieve a high diffuse reflectivity, it may be preferable for the paint/ink to contain pigments with high refractive index. One such pigment is $TiO_2$, which has a refractive index n=2.5-2.7. It may also be desirable, e.g. to reduce Fresnel losses, for the refractive index of the paint binder (vehicle) to match the refractive index of the spacer 22. For example, depending on refractive index, a range of vehicles are available such as oxidizing soya alkyds, tung oil, acrylic resin, vinyl resin and polyvinyl acetate resin. The properties of the paint may be further improved by use of e.g. EVOQUE™ Pre-Composite Polymer Technology provided by the Dow Chemical Company. There are many other diffusively reflective coating materials that are commercially available, e.g. the fluoropolymer Spectralon, polyurethane enamel, barium-sulphate-based paints or solutions, granular PTFE, microporous polyester, Makrofol® polycarbonate films, GORE® Diffuse Reflector Product, etc. Also, white paper may be used. Alternatively, the diffusively reflective material may be a so-called engineered diffuser. Examples of engineered diffusers include holographic diffusers, such as so-called LSD films provided by the company Luminit LLC.

According to other alternatives, the diffusively reflective wall(s) of the recycler 40 may be implemented as a micro-structure in the spacer material 22 with an overlying coating of specularly reflective material. The micro-structure may e.g. be provided in the spacer material 22 by etching, embossing, molding, abrasive blasting, etc. Alternatively, the micro-structure may be attached as a film or sheet onto the spacer material 22. The above-described mirror with an optical power tailored to incoming light may also be provided as a micro-structure in or on the spacer material 22.

There are other ways of integrating the angular filter in the outcoupling structure than by arranging the above-described multilayer structure in front of the detector 3. For example, the angular filter may be formed by a structure that geometrically and mechanically limits the light rays that can reach the detector, as exemplified below with reference to FIGS. 18A and 18B.

Figure 18A:
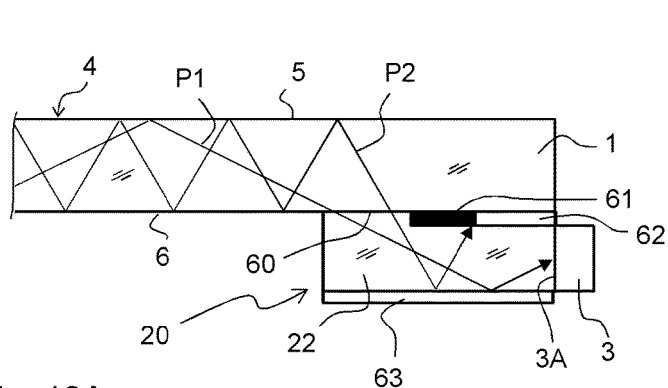
FIGS. 18A-18B are section and plan views of an alternative outcoupling structure.
Figure 18B:
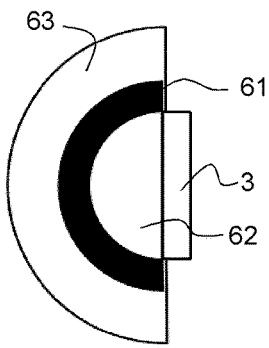

FIG. 18A is a side view of an alternative outcoupling structure as attached to the panel 1, and FIG. 18B is a top plan view of the outcoupling structure. The outcoupling structure forms an angular filter 20 by defining an angularly limited propagation path from an outcoupling port 60 to the light-sensitive surface 3A. The angular filter 20 is defined by non-transmissive layers 61-63 on a body of light transmissive material, e.g. any of the spacer materials discussed in relation to FIG. 17A. Layers 61 and 62 are arranged on top of the body, to define the outcoupling port 60 at the interface between the body and the panel 1. Layer 61 is light-absorbing and formed as an annulus segment. Layer 61 only needs to be absorbing to light inside the body. Layer 62 is specularly reflective and formed as a semi-circle, which may extend to the inner radius of the annulus segment, as shown, or to the outer radius of the annulus segment (i.e. between layer 61 and the panel 1). The top of the body is attached to the rear surface 5 of the panel 1, and the light detector 3 is attached to a short-side of the body such that the surface 3A is shielded beneath the layers 61, 62. Layer 63 is specularly reflective and attached to bottom side of the body.

FIG. 18A illustrates one propagating ray P1 that passes the outcoupling port 60 at an AOI within the angular range of the filter 20 and is reflected by layer 63 onto surface 3A. FIG. 18A also illustrates a propagating ray P2 that propagates in the panel 1 by TIR and passes the outcoupling port 60 and is reflected by layer 63 onto layer 61 which absorbs the ray. As seen, the structure of layers 61-63 define the angular range of the filter 20. The width of the layer 61 along the respective detection line defines $\theta_{min}$, for a given vertical height of the body. To achieve similar $\theta_{min}$ for all detection lines in the plane of the panel, layer 61 is shaped as an annulus segment, although more complicated shapes are conceivable to achieve a corresponding effect. It is conceivable that the refractive index $n_{spacer}$ of the body is selected to yield a desired $\theta_{max}$ by TIR in the interface between the body and the panel: $n_{spacer} = n_{panel} \cdot \sin(\theta_{max})$.

Further variants of the outcoupling structures in FIGS. 11 and 18 are given in the preceding patent application WO2014/098744, which application is hereby incorporated by reference.

Figure 19:
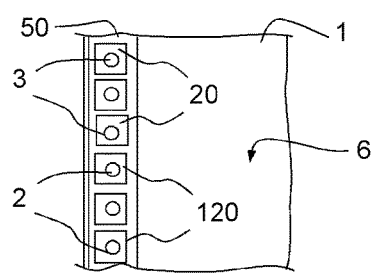
FIG. 19 is a bottom plan view of a sequence of structures arranged on a panel to couple light into and/or out of the panel.

FIG. 19 is a bottom plan view of a part of a touch-sensitive apparatus, to illustrate a sequence of emitters 2 and/or detectors 3 that are optically coupled to a panel 1 near one of the panel edges, via a visibility filter 50 which is applied to the rear surface 6 to extend as a coherent, elongate strip along the panel edge. Each emitter 2 and detector 3 is coupled to the panel 1 by a coupling structure. For the emitters 2 the light coupling mechanism is denoted 120, as in FIG. 2A, but it should be realized that the specific structure of this mechanism 120 may e.g. be anyone of those described with reference to FIGS. 4-10. For the detectors 3, the coupling structure may comprise an angular filter 20 and a possibly a recycler 40 (not shown). The light coupling mechanisms 20 and 120 are arranged as discrete units along the panel edge. It shall be noted that the neither the shape nor the specific location of the respective emitters 2 and detectors 3, and their coupling structures, necessarily reflect an optimum configuration. On the contrary, FIG. 19 is merely intended to provide a schematic representation to indicate the distribution of the emitters 2 and detectors 3 over a common visibility filter 50.

The foregoing description indicates that certain selections of the lower limit $\theta_{min}$ (e.g. with respect to the cutoff angles $\theta_{c,l}$, $\theta_w$, $\theta_f$) results in significant performance improvement. However, it is possible that performance improves gradually as the lower limit $\theta_{min}$ is increased from the critical angle $\theta_c$, e.g. in steps 1°, at least in certain installations. Testing of a certain installation may thus indicate that an acceptable performance improvement is attained at another selected $\theta_{min}$, e.g. any angle between $\theta_c$ and $\theta_w$, between $\theta_w$ and $\theta_f$, and between $\theta_f$ and $\theta_{sc}$. The same applies to the selection of refractive index of the lamination layer for suppressing the influence of contamination via the cutoff angle $\theta_{c,l}$.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the scope of the appended claims.

The invention claimed is:

1. A touch-sensitive apparatus, comprising:
   a light transmissive panel comprising a front surface and an opposite, rear surface;
   at least one light emitter configured to optically connect to the panel and further configured to generate light that propagates by total internal reflection inside the panel across a touch-sensitive region on the panel;
   wherein said light emitter comprises a vertical-cavity surface-emitting laser ("VCSEL") array including a number of VCSELs configured to be driven to collectively form one light emitter;
   a light coupling mechanism configured to connect the emitter to the panel, and further configured to give light from a plurality of the VCSELs in the VCSEL array substantially the same spread in the panel; and
   at least one light detector configured to optically connect to the panel to receive propagating light from the emitter;
   wherein said light coupling mechanism includes a plurality of beam-deflecting elements configured to spread light emanating from the VCSELs of the emitter;
wherein each beam-deflecting element is a substantially cylindrical convex mirror having a cylinder axis arranged at an angle to a general output beam direction of said VCSELs.

2. The touch-sensitive apparatus of claim 1, wherein said light coupling mechanism is configured to direct light from a plurality of the VCSELs of the array to impinge on the front surface at a substantially common predetermined angle ($\theta$) of incidence from within the panel.

3. The touch-sensitive apparatus of claim 1, wherein said light coupling mechanism is configured to give light from a plurality of the VCSELs of the array a substantially common fan-shaped spread horizontally within the panel.

4. The touch-sensitive apparatus of claim 1, wherein said light coupling mechanism includes one beam-deflecting element for each VCSEL of the emitter.

5. The touch-sensitive apparatus of claim 1, wherein said light coupling mechanism includes one beam-deflecting element for a subset of the number of VCSELs of the emitter, which subset of VCSELs are arranged along a column perpendicular to the front surface of the panel.

6. The touch-sensitive apparatus of claim 1, wherein said beam-deflecting elements comprises reflecting elements and refracting elements.

7. The touch-sensitive apparatus of claim 1, wherein said beam-deflecting elements are arranged in a layer over the VCSEL array.

8. The touch-sensitive apparatus of claim 1, wherein said beam-deflecting elements are staggered over the VCSEL array.

9. The touch-sensitive apparatus of claim 1, wherein said light coupling mechanism comprises a layer having a diffractive beam-deflecting pattern configured to deflect light from each VCSEL of the array.

10. The touch-sensitive apparatus of claim 9, comprising a visibility filter between the emitter and the rear surface of the panel.

11. The touch-sensitive apparatus of claim 1, wherein said emitter is connected to the rear surface of the panel via said light coupling mechanism.

12. The touch-sensitive apparatus of claim 1, wherein the plurality of VCSELs of said emitter are connected to be driven in parallel.

13. The touch-sensitive apparatus of claim 1, comprising a plurality of spaced apart emitters spaced apart so as to define a grid of propagation paths across the touch-sensitive region between respective pairs of one light emitter and one light detector, where each emitter is a separate VCSEL array.

14. The touch-sensitive apparatus of claim 1, comprising a plurality of spaced apart detectors so as to define a grid of propagation paths across the touch-sensitive region between respective pairs of one light emitter and one light detector.

15. The touch-sensitive apparatus of claim 1, wherein a bandpass filter, tailored to an operating wavelength for said VCSELs, is arranged at said detector.

16. The touch-sensitive apparatus of claim 15, wherein the confined range extends from a lower angle limit $\theta_{min}$ to an upper angle limit $\theta_{max}$, wherein the lower angle limit $\theta_{min}$ is equal to or larger than a critical angle $\theta_c$, which is given by $\theta_c$=arc sin($1/n_{panel}$), with $n_{panel}$ being the refractive index of the light transmissive panel at the outcoupling region.

17. The touch-sensitive apparatus of claim 15, wherein the lower angle limit $\theta_{min}$ is equal to or larger than a second cut-off angle $\theta_f$=arc sin($n_f/n_{panel}$), with $n_f$ being the refractive index of finger fat, $n_{panel}$>$n_f$.

18. The touch-sensitive apparatus of claim 1, wherein said light detector is optically connected to the light transmissive panel via an angular filter which is applied to an outcoupling region of the panel and is configured to transmit the propagating light only within a confined range of angles with respect to the normal of the outcoupling region; and
   wherein said light coupling mechanism is configured to control light input into the panel such that it reaches the outcoupling region predominantly within said confined range of angles.

19. A touch-sensitive apparatus, comprising:
   a light transmissive panel comprising a front surface and an opposite, rear surface;
   at least one light emitter configured to optically connect to the panel and further configured to generate light that propagates by total internal reflection inside the panel across a touch-sensitive region on the panel;
   wherein said light emitter comprises a vertical-cavity surface-emitting laser ("VCSEL") array including a number of VCSELs configured to be driven to collectively form one light emitter;
   a light coupling mechanism configured to connect the emitter to the panel, and further configured to give light from a plurality of the VCSELs in the VCSEL array substantially the same spread in the panel;

at least one light detector configured to optically connect to the panel to receive propagating light from the emitter; and a visibility filter between the at least one light emitter and the rear surface of the panel.

20. A touch-sensitive apparatus, comprising:

a light transmissive panel comprising a front surface and an opposite, rear surface;

at least one light emitter configured to optically connect to the panel and further configured to generate light that propagates by total internal reflection inside the panel across a touch-sensitive region on the panel;

wherein said light emitter comprises a vertical-cavity surface-emitting laser ("VCSEL") array including a number of VCSELs configured to be driven to collectively form one light emitter;

a light coupling mechanism configured to connect the emitter to the panel, and further configured to give light from a plurality of the VCSELs in the VCSEL array substantially the same spread in the panel; and at least one light detector configured to optically connect to the panel to receive propagating light from the emitter;

wherein a bandpass filter, tailored to an operating wavelength for said VCSELs, is arranged at said at least one light detector.

* * * * *